(12) United States Patent
Vemulapally et al.

(10) Patent No.: US 10,791,639 B2
(45) Date of Patent: Sep. 29, 2020

(54) METHODS, SYSTEMS, AND APPARATUSES FOR PREVENTING MOISTURE ACCUMULATION ON A DISPLAY SCREEN

(71) Applicant: Hand Held Products, Inc., Fort Mill, SC (US)

(72) Inventors: Ashwini Devi Vemulapally, Telangana (IN); Karthik Gundlapalli, Andhra Pradesh (IN)

(73) Assignee: HAND HELD PRODUCTS, INC., Ford Mill, SC (US)

( * ) Notice: Subject to any disclaimer, the term of this patent is extended or adjusted under 35 U.S.C. 154(b) by 0 days.

(21) Appl. No.: 16/508,655

(22) Filed: Jul. 11, 2019

(65) Prior Publication Data
US 2020/0022275 A1    Jan. 16, 2020

(30) Foreign Application Priority Data
Jul. 13, 2018    (IN) .............................. 201811026194

(51) Int. Cl.
| H05K 5/02 | (2006.01) |
| G06F 3/044 | (2006.01) |
| G06F 3/045 | (2006.01) |
| H05B 3/86 | (2006.01) |
| G01K 1/14 | (2006.01) |
| G01V 8/10 | (2006.01) |
| H05K 5/00 | (2006.01) |

(52) U.S. Cl.
CPC ............ *H05K 5/0213* (2013.01); *G01K 1/14* (2013.01); *G01V 8/10* (2013.01); *G06F 3/044* (2013.01); *G06F 3/045* (2013.01); *H05B 3/86* (2013.01); *H05K 5/0086* (2013.01)

(58) Field of Classification Search
CPC ...... H05K 5/0213; H05K 5/0086; G01K 1/14; G01V 8/10; G06F 3/0304; G06F 3/041; G06F 3/042; G06F 3/044; G06F 3/045; G06F 2203/04103; G06F 2203/04104; G06K 9/0004; H05B 3/86
See application file for complete search history.

(56) References Cited

U.S. PATENT DOCUMENTS

| 4,987,289 A | 1/1991 | Bishop et al. |
| 6,313,457 B1 * | 11/2001 | Bauer .................... B60R 1/088 250/214 C |

(Continued)

OTHER PUBLICATIONS

Conflux LCD Heater, [online], [retrieved Feb. 14, 2020) retrieved from the Internet URL: http://www.conflux.se/lcd_heather.html, 2 pages.

*Primary Examiner* — Tom V Sheng
(74) *Attorney, Agent, or Firm* — Alston & Bird LLP

(57) ABSTRACT

Various embodiments illustrated herein disclose a method for operating a display screen in an electronic device. The method includes detecting an event on the display screen of the electronic device based on an input received from a plurality of sensors in the display screen. Further, the method includes identifying one or more first areas on the display screen based on the detected event. Furthermore, the method includes altering one or more electric currents supplied to one or more photo transmitters associated with the one or more identified first areas of the display screen, wherein the one or more photo transmitters is configured to generate heat in the one or more identified first areas.

20 Claims, 22 Drawing Sheets

(56) References Cited

U.S. PATENT DOCUMENTS

| | | | |
|---|---|---|---|
| 9,207,800 B1* | 12/2015 | Eriksson | G06F 3/041 |
| 9,285,936 B2* | 3/2016 | Yoo | G06F 1/3265 |
| 9,405,399 B2 | 8/2016 | Hewitt et al. | |
| 10,372,265 B2* | 8/2019 | Christiansson | G06F 3/0421 |
| 2012/0249476 A1* | 10/2012 | Schwartz | G06F 3/044 |
| | | | 345/174 |
| 2013/0063368 A1 | 3/2013 | Geiger et al. | |
| 2015/0002752 A1* | 1/2015 | Shepelev | G06F 3/0412 |
| | | | 349/12 |
| 2015/0286306 A1* | 10/2015 | Abrams | G06F 3/0421 |
| | | | 345/175 |
| 2017/0161541 A1* | 6/2017 | Li | H01L 27/14629 |
| 2019/0064998 A1* | 2/2019 | Chowdhury | H04N 5/232933 |
| 2019/0362060 A1* | 11/2019 | Baek | G06F 21/32 |

\* cited by examiner

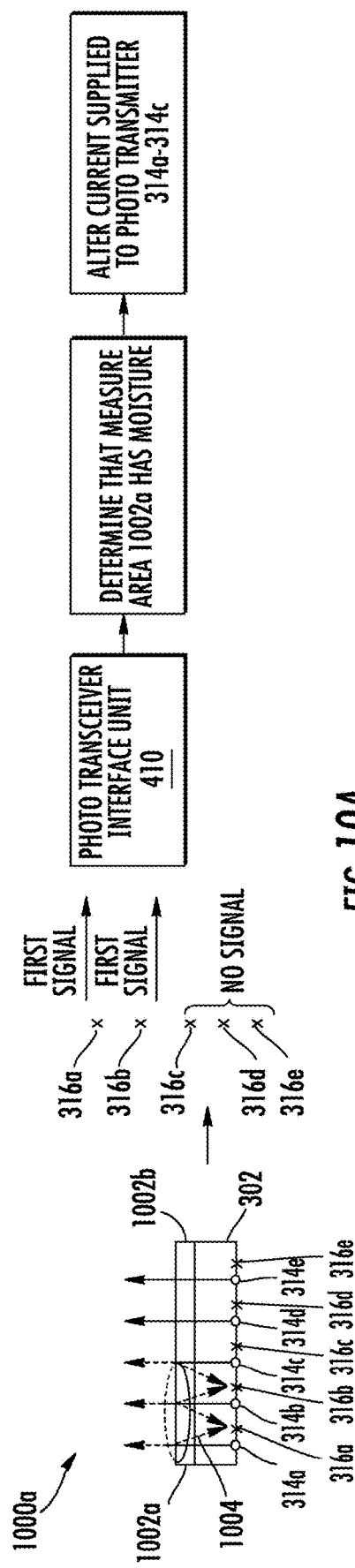
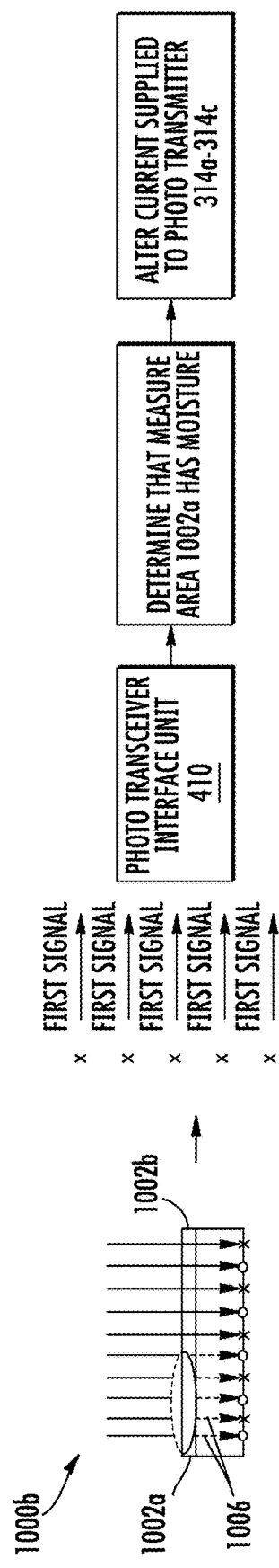
FIG. 10A
FIG. 10B

METHODS, SYSTEMS, AND APPARATUSES FOR PREVENTING MOISTURE ACCUMULATION ON A DISPLAY SCREEN

CROSS-REFERENCE TO RELATED APPLICATIONS

This application claims the benefit of Indian Patent Application No. 201811026194 filed on Jul. 13, 2018, the disclosure of which is herein incorporated by reference in its entirety.

BACKGROUND

Applicant has identified a number of deficiencies and problems associated with conventional electronic device. Through applied effort, ingenuity, and innovation, many of these identified problems have been solved by developing solutions that are included in embodiments of the present disclosure, many examples of which are described in detail herein.

BRIEF SUMMARY

Exemplary embodiments of the present disclosure relate generally to an electronic device and, more particularly, to methods, systems, and apparatuses for preventing moisture accumulation on a display screen of the electronic device.

Various embodiments illustrated herein disclose an electronic device that includes a display screen. The display screen includes a plurality of photo transmitters. Additionally, the display screen includes a plurality of first sensors configured to detect one or more touch inputs from an operator of the electronic device through the display screen. The electronic device further includes a processor communicatively coupled to the display screen. The processor is configured to generate a display screen usage pattern based at least in part on the touch input and/or one or more first signals detected by the plurality of first sensors. Further, the processor is configured to identify one or more first areas on the display screen based on at least the display screen usage pattern. Additionally, the processor is configured to alter one or more electric currents supplied to one or more photo transmitters of the plurality of photo transmitters associated with the one or more first areas, causing the one or more photo transmitters to generate heat in the one or more first areas.

In some embodiments, the display screen further comprises a plurality of second sensors positioned among the plurality of photo transmitters and configured to generate a plurality of second signals indicative of moisture accumulation on the display screen. In some embodiments, the processor is further configured to generate a moisture accumulation pattern based at least in part on the plurality of second signals generated by the plurality of second sensors, wherein the one or more first areas on the display screen are identified based on the moisture accumulation pattern. In some embodiments, the moisture accumulation pattern indicates one or more second areas on the display screen, wherein the processor has historically determined moisture accumulation in the one or more second areas on the display screen.

In some embodiments, the plurality of second sensors are a plurality of light sensors, wherein each of the plurality of second signals is indicative of a transmissivity measurement or a reflectivity measurement of a corresponding measurement area on the display screen. In some embodiments, the processor is further configured to determine that the transmissivity measurement of the corresponding measurement area satisfies a transmissivity threshold; and identify the corresponding measurement area as one of the one or more first areas.

In some embodiments, the processor is further configured to: determine that the reflectivity measurement of the corresponding measurement area satisfies a reflectivity threshold; and identify the corresponding measurement area as one of the one or more first areas. In some embodiments, the plurality of first sensors are a plurality of touch screen sensors.

In some embodiments, the display screen usage pattern indicates one or more third areas on the display screen, wherein the one or more third areas have historically received touch inputs as detected by the plurality of first sensors.

In some embodiments, the electronic device further comprises a temperature sensor communicatively coupled to the processor and configured to determine a temperature of an ambient environment around the display screen. In some embodiments, the processor is further configured to: determine that the temperature of the ambient environment satisfies a temperature threshold; and determine the one or more first areas on the display screen based on the temperature.

Various embodiments illustrated herein disclose a display screen that includes a photo transceiver layer comprising a plurality of photo transmitters and a plurality of light sensors. Further, the display screen includes a glass substrate layer disposed on the photo transceiver layer. Additionally, the display screen includes a controller communicatively coupled to the plurality of photo transmitters and the plurality of light sensors. The controller is configured to receive a plurality of second signals from the plurality of light sensors, wherein the plurality of second signals is indicative of a transmissivity measurement or a reflectivity measurement of one or more measurement areas on the glass substrate. Further, the controller is configured to identify one or more first areas from the one or more measurement areas based on the transmissivity measurement or the reflectivity measurement associated with each of the one or more measurement areas. Additionally, the controller is configured to alter one or more electric currents supplied to one or more photo transmitters of the plurality of photo transmitters associated with the one or more first areas, causing the one or more photo transmitters to generate heat in the first one or more areas of the display screen.

In some embodiments, the controller is further configured to generate a moisture accumulation pattern based on identification of the one or more first areas. In some embodiments, the moisture accumulation pattern includes one or more second areas on the glass substrate layer, wherein the controller has historically determined moisture accumulations in the one or more second areas on the glass substrate layer.

Various embodiments illustrated herein disclose a method for operating a display screen in an electronic device. The method includes detecting, by a processor, an event on the display screen of the electronic device based on an input received from a plurality of sensors in the display screen, wherein the event on the display screen corresponds to at least detecting a moisture accumulation on the display screen. Further, the method includes identifying one or more first areas on the display screen based on the detected event. Furthermore, the method includes altering one or more electric currents supplied to one or more photo transmitters associated with the one or more identified first areas of the display screen, wherein the one or more photo transmitters is configured to generate heat in the one or more identified first areas.

In some embodiments, the event on the display screen corresponds to receiving a touch input through the display screen. In some embodiments, a plurality of first sensors of the plurality of sensors are configured to detect the touch input through the display screen and generate one or more first signals based on the touch input. In some embodiments, the method further comprising generating a display screen usage pattern that indicates one or more third areas on the display screen based on the one or more first signals.

In some embodiments, the method further comprises receiving, by the processor, a plurality of second signals from a plurality of second sensors of the plurality of sensors in the display screen, wherein the plurality of second signals is indicative of a transmissivity measurement or a reflectivity measurement of the display screen, wherein the one or more first areas on the display screen based on the plurality of second signals.

In some embodiments, the event corresponds to a display of a predetermined content on the display screen, wherein the one or more first areas are identified based on the display of the predetermined content on the display screen.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF DRAWINGS

The description of the illustrative embodiments can be read in conjunction with the accompanying figures. It will be appreciated that for simplicity and clarity of illustration, elements illustrated in the figures have not necessarily been drawn to scale. For example, the one or more dimensions of some of the elements are exaggerated relative to other elements. Embodiments incorporating teachings of the present disclosure are shown and described with respect to the figures presented herein, in which:

FIGS. 10A and 10B illustrate example methods for operating the display screen based on the detection of moisture accumulation on the display screen;

DETAILED DESCRIPTION

Figure 1:
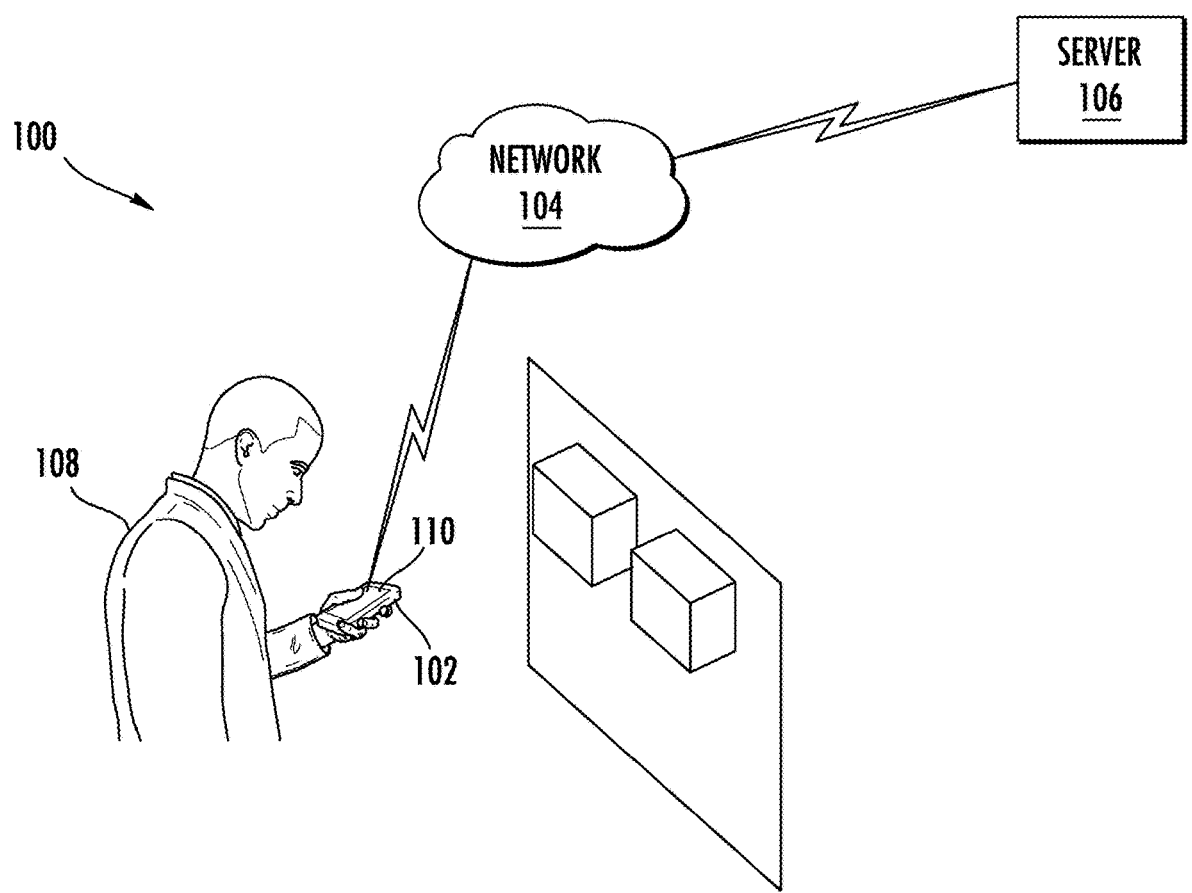
FIG. 1 illustrates an example material handling environment, according to one or more embodiments described herein.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout. Terminology used in this patent is not meant to be limiting insofar as devices described herein, or portions thereof, may be attached or utilized in other orientations The term "comprising" means "including but not limited to," and should be interpreted in the manner it is typically used in the patent context. Use of broader terms such as comprises, includes, and having should be understood to provide support for narrower terms such as consisting of, consisting essentially of, and comprised substantially of The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment)

The word "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

In work environments, such as warehouses, retails stores, material handling environments and/or the like, a worker may have to move around the facility to perform various operations such as, but not limited to, carrying objects, picking objects from racks, scanning the objects, dimensioning the objects, and/or the like. Typically, the worker may utilize electronic devices such as hand-held scanners, barcode readers, smartphones, etc. to perform the aforementioned operations. A typical electronic device may include a display screen that may be configured to display tasks for the worker to perform. The worker may further provide inputs through the display screens to update the status of the tasks. For instance, the worker may provide touch input through the display screen to mark a task as completed.

Certain work environments maintain sub-zero temperatures. Operating electronic devices in such work environments may be a challenge due to at least the accumulation of moisture on the display screen of the electronic device. For example, due to the accumulation of the moisture on the display screen, the worker may not be able to read the tasks on the display screen. Further, the worker may not be able to provide inputs through the display screen, as content displayed on the display screen is hazy (due to accumulation of moisture) and/or the moisture on the display screen presents the touch sensors from reading touch inputs. This may hamper the overall productivity and efficiency of the worker performing a task in such work environments.

According to one or more embodiments described herein, a display screen is disclosed. The display screen includes a photo transceiver layer. The photo transceiver layer includes a plurality of photo transmitters such as LED or any other light source. Further, the photo transceiver layer includes a plurality of sensors. Additionally, the display screen includes a glass substrate layer disposed on top of the photo transceiver layer.

The plurality of photo transmitters may be configured to generate a plurality of light signals that passes through the glass substrate layer. When moisture accumulates/forms on a surface of the glass substrate layer, a portion of the plurality of light signal may get reflected back from the surface of the glass substrate layer. A plurality of second sensors (e.g., photo detectors) may detect this reflected portion of light signal and may accordingly generate a second signal based on the reflected portion of light signal. The second signal is indicative of a measurement of transmissivity/reflectivity of the glass substrate layer. If the transmissivity/reflectivity measurement of the glass substrate layer satisfies a transmissivity/reflectivity threshold, a controller in the display screen may determine that the moisture has accumulated on the glass substrate layer.

Thereafter, the controller of the display screen may be configured to determine a first area on the display screen where the moisture has accumulated based on the location of one or more second sensors that have received the reflected portion of the light signal. After determining the first area, the controller may be configured to alter one or more electric currents supplied to a set of photo transmitters associated with the first area on the display screen. This causes the one or more photo transmitters to generate sufficient heat to evaporate the accumulated moisture on the first area on the display screen.

Because of the presence of the one or more second sensors in the display screen, the controller in the display screen is able to determine the exact location of moisture accumulation. Further, because the controller utilizes the photo transmitters in the display screen to heat the specific portions of the display screen, no additional heating element is required to heat the display screen in order to remove any accumulated moisture. Hence, the cost of the proposed solution is less in comparison to the conventional display screen.

FIG. 1 illustrates an example material handling environment 100, according to one or more embodiments described herein. The material handling environment 100 may refer to environments related to, but not limited to, manufacturing of the items, inventory storage of the items, packaging and unpackaging of the items, preparing customer orders, recording items related information based on scanning and identification of the items, and shipment processing (including shipping and logistics distribution of the items). In such environments, many workers perform different operations, which may involve handling of the items during various phases (including, but not limited to, accumulation, sortation, scanning and identification, packaging and shipment preparation etc.), of overall operation cycle of the material handling environment 100. For example, the workers are involved in manual packaging and unpackaging of the items while preparing customer orders for shipping. In another example, the workers may handle placing of the items in an accumulation zone of a conveyor system for automated packaging of the items. In some environments, workers may use electronic devices (e.g., an electronic device 102) such as personal digital assistants (PDAs) or mobile devices that may be communicatively connected to a headset and a server (e.g., a server 106), for receiving automated or voice directed instructions for performing various operations including scanning and identification of labels, such as barcodes, RFID tags, etc. affixed on the items for shipment preparation. Thus, in these environments, many workers are usually involved in performing various operations involving handling items and performing operations including interaction with different machines, such as an accumulator, a dimensioner, a scanning and identification device, etc., for shipment processing and transportation. As illustrated in FIG. 1, the material handling environment 100 includes the electronic device 102, a network 104, the server 106. The electronic device 102 and the server 106 are communicatively coupled with each other through the network 104.

The electronic device 102 corresponds to a computing device that may include suitable logic or circuitry to perform a predetermined operation such as, but is not limited to, executing a predetermined application, scanning a bar code, determining dimensions of an object, displaying an instruction to an operator (e.g., the operator 108) of the electronic device 102 to perform a task, communicating with other electronic devices (e.g., the server 106) through the network 104, and executing word processing applications. In an example embodiment, the electronic device 102 may include a display screen 110, as is further described in conjunction FIG. 2. The display screen 110 may be configured to display information/content to the operator 108 of the electronic device 102. For example, the electronic device 102 may be configured to display instructions on the display screen 110 to the operator 108 based on which the operator 108 of the electronic device 102 may perform a task. Some examples of the electronic device 102 may include, but are not limited to, a mobile phone, a computer, a laptop, a bar code scanner, palm top computers, PDA, and/or any other device that includes the display screen 110. The structure of the electronic device 102 is described later in conjunction with FIG. 2.

The network 104 may be any means such as a device or circuitry embodied in either hardware or a combination of hardware and software that is configured to receive and/or transmit data from/to various devices of the material handling environment 100 (e.g., the electronic device 102 and the server 106). In this regard, the network 104 may include, for example, a network interface for enabling communications with a wired or wireless communication network. For example, the network 104 may include one or more network interface cards, antennae, buses, switches, routers, modems, and supporting hardware and/or software, or any other device suitable for enabling communications via a network. Additionally, or alternatively, the network 104 may include the circuitry for interacting with the antenna(s) to cause transmission of signals via the antenna(s) or to handle receipt of signals received via the antenna(s). Such signals may be transmitted using one or more communication protocols, such as Bluetooth® v1.0 through v3.0, Bluetooth Low Energy (BLE), infrared wireless (e.g., IrDA), ultra-wideband (UWB), induction wireless transmission, Wi-Fi, Near Field Communications (NFC), TCP/IP, UDP, 2G, 3G, 4G, 5G, Worldwide Interoperability for Microwave Access (WiMAX), or other proximity-based communications protocols.

The server 106 may include suitable logic and/or circuitry that may be configured to receive/transmit data from/to the electronic device 102 through the network 104. For example, the server 106 may be configured to transmit instruction related to the task to be performed by the operator 108 of the electronic device 102. In an example embodiment, the server 106 may be implemented using various application servers such as, but are not limited to, JBOSS™, Apache™, Apache-Tomcat™, and/or the like.

Figure 2:
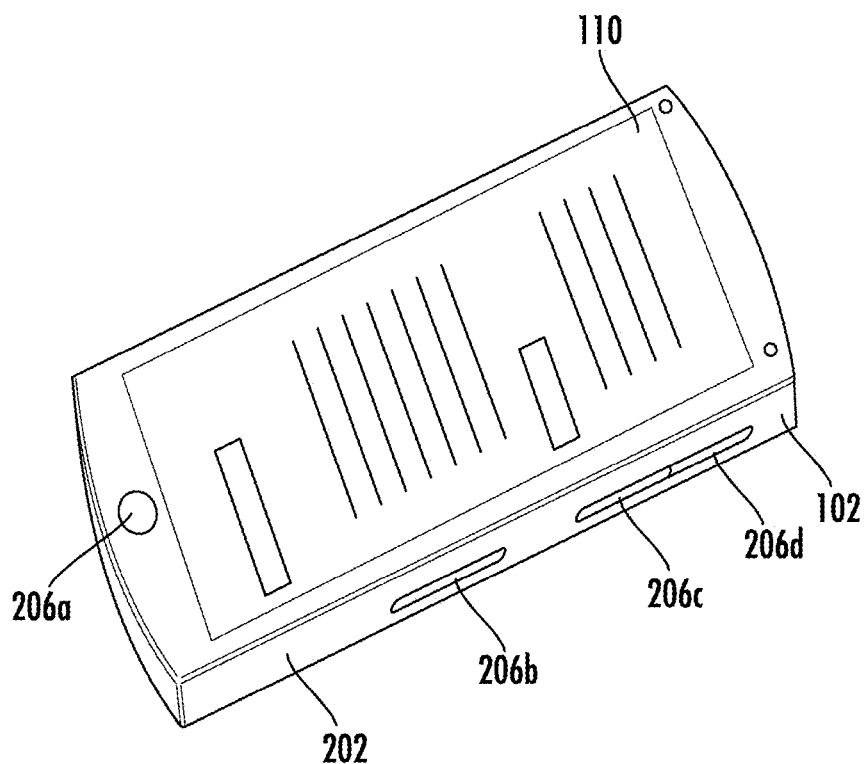
FIG. 2 illustrates a perspective view of an electronic device, according to one or more embodiments described herein.

FIG. 2 illustrates a perspective view 200 of the electronic device 102, according to one or more embodiments described herein. In an example embodiment, the electronic device 102 includes a housing 202, the display screen 110, and one or more buttons 206a, 206b, 206c and 206d. The housing 202 may be configured receive the one or more electronic circuits (not shown) such as, but not limited to, a processor, a memory unit, input/output device interface, battery, and/or the like that may enable the electronic device 102 to display content (e.g., task to be performed by the operator 108) on the display screen 110. Further, the housing 202 may be configured to receive the display screen 110 and the one or more buttons 206a, 206b, 206c and 206d.

The display screen 110 may include suitable logic, circuitry, interfaces, and/or code that may facilitate rendering or displaying of the content on the display screen 110. In an example embodiment, the display screen 110 may be realized through technologies such as, Cathode Ray Tube (CRT) based display, Liquid Crystal Display (LCD), Light Emitting Diode (LED) based display, Organic LED display technology, and Retina display technology. In some embodiments, the display screen 110 may further include a touch panel, such as a thermal touch panel, a capacitive touch panel, and/or a resistive touch panel, which may enable the operator 108 to provide inputs to the electronic device 102 and/or the display screen 110. The structure of the display screen 110 is further described in conjunction with FIG. 3A and FIG. 3B.

In an example embodiment, the one or more buttons 206a, 206b, and 206c are configured to facilitate the operator 108 to provide inputs to the electronic device 102. For example, the operator 108 may be configured to press the button 206c to reduce the volume of the audio signal generated by the electronic device 102. In another example, the operator 108 may be configured to press the button 206b to switch ON or switch OFF the display screen 110. In yet another example, the operator 108 may be configured to press the button 206b to switch ON or switch OFF the electronic device 102.

Figure 3:
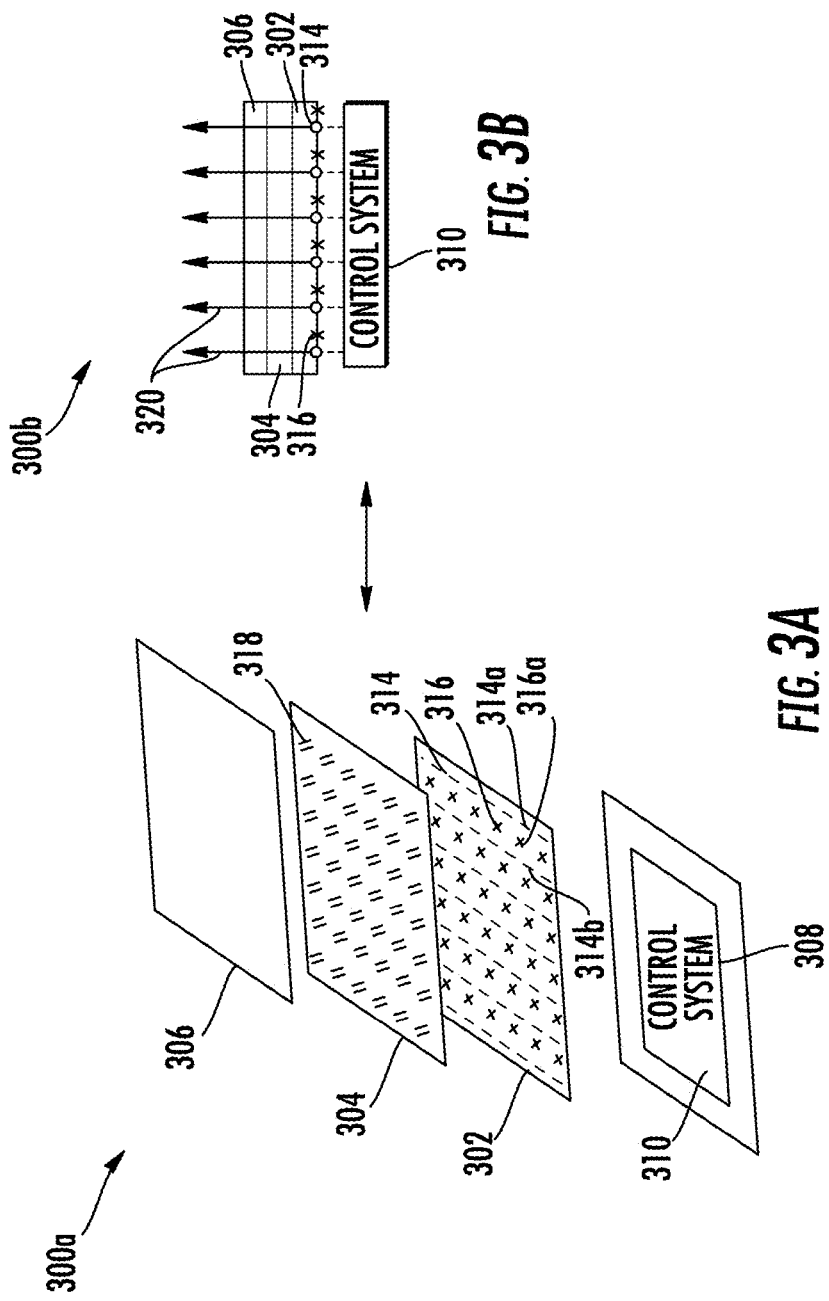
FIG. 3A illustrates an exploded view of a display screen, according to one or more embodiments described herein.
FIG. 3B illustrates a sectional view of the display screen, according to one or more embodiments described herein.

FIG. 3A illustrates an exploded view 300a of the display screen 110, according to one or more embodiments described herein. In an example embodiment, the exploded view 300 of the display screen 110 illustrates that the display screen 110 includes a photo transceiver layer 302, a touch panel 304, a glass substrate layer 306, and an electronic circuit layer 308. In an example embodiment, the photo transceiver layer 302 and the touch panel 304 are communicatively coupled to the electronic circuit layer 308.

The photo transceiver layer 302 corresponds to a layer that is capable of generating and detecting light signals. For example, the photo transceiver layer 302 includes a plurality of photo transmitters 314 that may be capable of generating light signals based on electrical signals received from the electronic circuit layer 308. In some examples, the generated light signals may be representative of the content displayed on the display screen 110. In an example embodiment, the plurality of photo transmitters 314 may be fabricated uniformly on the photo transceiver layer 302 in such a manner that a photo transmitter of the plurality of photo transmitters is equally spaced apart from adjacent photo transmitters of the plurality of photo transmitters. Some examples of the plurality of photo transmitters 314 may include, but are not limited to, a Light Emitting Diode (LED), a LASER, and/or the like.

Further, to enable detection of the light signals, the photo transceiver layer 302 includes a plurality of second sensors 316 that are fabricated on the photo transceiver layer 302 in such a manner that the plurality of second sensors 316 is positioned among the plurality of photo transmitters 314. In some examples, the plurality of the second sensors 316 are positioned between two adjacent photo transmitters of the plurality of photo transmitters 314. For example, the second sensor 316a is positioned between the photo transmitters 314a and the photo transmitter 314b. In some examples, the scope of the disclosure is not limited to the second sensor 316a of the plurality of second sensors 316 being positioned between the two adjacent photo transmitters (e.g., 314a and 314b). In an alternative embodiment, the plurality of second sensors 316 may be positioned in the photo transceiver layer 302 in any other uniform pattern, without departing from the scope of the disclosure. For example, the plurality of second sensors 316 may be positioned on the photo transceiver layer 302 in such a manner that the second sensor 316a of the plurality of second sensors 316 is positioned after every predetermined count of photo transmitters. For example, the second sensor 316a may be positioned on the photo transceiver layer 302 after every two photo transmitters. Similarly, other uniform patterns of positioning of the plurality of second sensors 316 may be contemplated, without departing from the scope of the disclosure.

In an example embodiment, the plurality of second sensors 314 may correspond to a plurality of light sensors that may be configured to generate a plurality of second signals based on detection of light signals. In an example embodiment, a second signal may correspond to a voltage signal that has one or more characteristics such as, but not limited to, an amplitude and a frequency. In an example embodiment, a measurement of the one or more characteristics of the second signal may be indicative of an intensity of light signal detected by the second sensor of the plurality of second sensors 316.

In some examples, the plurality of second sensors 316 may correspond to at least one of a photodetector, a photodiode, or a photo resistor that may detect the plurality of light signals received from an ambient environment of the display screen 110 (e.g., external light source). In such an example, the plurality of second sensors 316 may be configured to detect the plurality of light signals that originate in the ambient environment around the display screen 110 and that passes through the glass substrate layer 306 and the touch panel 304. Therefore, the intensity of the plurality of light signals detected by the plurality of second sensors 316 is dependent on a transmissivity of the glass substrate layer 306 and the touch panel 304 (hereinafter referred to as the transmissivity of the display screen 110). In an example embodiment, the transmissivity of the display screen 110 may correspond to a measurement of the intensity of a light signal that the display screen 110 allows to pass through. Because the measurement of the one or more characteristics associated with each of the plurality of second signals is indicative of the intensity of the light signal detected by the plurality of second sensors 316, the measurement of the one or more characteristics associated with the plurality of the second signals corresponds to the transmissivity measurement of the display screen 110.

In another example, the plurality of second sensors 316 may be configured to detect a portion of the plurality of light signals generated by the plurality of photo transmitters 314. In an example embodiment, the portion of the plurality of light signals generated by the plurality of photo transmitters 314 may correspond to the light signals that are reflected from the glass substrate layer 306. Therefore, in such an example, the plurality of second signals generated by the plurality of second sensors 316 may be indicative of a reflectivity measurement of the glass substrate layer 306 (hereinafter referred to as reflectivity of the display screen 110). Therefore, the measurement of the one or more characteristics associated with the plurality of second signals, in such an embodiment, corresponds to the reflectivity measurement of the display screen 110.

In some examples, the scope of the disclosure is not limited to the plurality of second sensors 316 corresponding to the light sensors that are configured to determine the transmissivity measurement or reflectivity measurement. In an alternative embodiment, the plurality of second sensors 316 may correspond to moisture sensors that are configured to detect accumulation of moisture on the display screen 110, without departing from the scope of the disclosure.

In some examples, as discussed above, each second sensor of the plurality of second sensors 316 are fixedly positioned among the plurality of photo transmitters 314 on the photo transceiver layer 302. Therefore, each second sensor of the plurality of second sensors 316 may receive the plurality of light signals only through a specific portion of the glass substrate layer 306. Accordingly, the plurality of second signals generated by the plurality of second sensors 316 is indicative of the transmissivity or reflectivity measurement of corresponding specific portion of the glass substrate layer (hereinafter referred to as measurement area on the display screen 110), as is further described in conjunction with FIG. 6. Because the plurality of second sensors 316 are positioned throughout the span of the display screen 110 (e.g., throughout the span of the photo transceiver layer 302) and each second sensor of the plurality of second sensors 316 receives light signal from the specific portion on the glass substrate layer (i.e., the measurement area), the display screen 110 is said to be divided into one or more measurement areas.

The touch panel 304 may correspond to a transparent layer that is disposed on the photo transceiver layer 302. In an example embodiment, the touch panel 304 includes a plurality of first sensors 318 that is configured to detect a touch input from the operator 108 of the electronic device 102. For example, the plurality of first sensors 318 may correspond to an array of capacitive sensors that may be configured to detect the touch input based on a change in the capacitance of the array of capacitive sensors. In another example, the plurality of first sensors 318 may correspond to a plurality of resistive sensors that may be configured detect the touch input based on a change in the resistivity of the plurality of resistive sensors. In an example embodiment, each first sensor of the plurality of first sensors 318 may be configured to generate one or more first signals based on the detection of the touch input, as is further described in conjunction with FIG. 14. Further, the first signal may be indicative of a location on the touch panel 304 (hereinafter referred to as the location of the display screen 110), which has received the touch input, as is further described in conjunction with FIG. 16. Further, the touch panel 304 may be configured to transmit the first signal to the electronic circuit layer 308.

In an example embodiment, the glass substrate layer 306 may correspond to a transparent protective glass that is disposed on the touch panel 304. The glass substrate layer 306 may protect the touch panel 304, the photo transceiver layer 302, and/or the electronic circuit layer 308 from damage. In some examples, the scope of the disclosure is not limited to the glass substrate layer 306 being disposed on top of the touch panel 304. In an alternative embodiment, the glass substrate layer 306 and the touch panel 304 may be fabricated on a single layer. In such an embodiment, the touch panel 304 may be embedded in the glass substrate layer 306. Some examples of the glass substrate layer 306 may be include, but not limited to GORILLA GLASS™.

In an example embodiment, the electronic circuit layer 308 may correspond to a printed circuit board (PCB) that is communicatively coupled with the photo transceiver layer 302 and the touch panel 304. In some example embodiments, the electronic circuit layer 308 may include a plurality of driver circuits, interfaces, controllers, that enables the electronic circuit layer 308 to communicate with the photo transceiver layer 302 and the touch panel 304. In an example embodiment, the electronic circuit layer 308 may further include a control system 310 that is configured to control the operation of the display screen 110. The operation and structure of the control system 310 is described in conjunction with FIG. 4.

FIG. 3B illustrates a sectional view 300b of the display screen 110, according to one or more embodiments described herein. The sectional view 300b depicts that the control system 310 is communicatively coupled with the photo transceiver layer 302 and the touch panel 304. More particularly, the control system 310 is communicatively coupled with the plurality of photo transmitters 314 and the plurality of second sensors 316 in the photo transceiver layer 302. Further, the control system 310 is communicatively coupled to the plurality of first sensors 318 in the touch panel 304. Further, the sectional view 300b depicts that the glass substrate layer 306 is disposed on the touch panel 304, which is further disposed on the photo transceiver layer 302.

When the plurality of photo transmitters 314 generates the plurality of light signals (e.g., 320) (indicative of the content displayed on the display screen 110), the light signals 320 pass through the touch panel 304 and the glass substrate layer 306.

In some embodiment, the scope of the disclosure is not limited to having a photo transceiver layer 302 having both the plurality of photo transmitters 314 and the plurality of second sensors 316. In an example embodiment, the plurality of second sensors 316 may be formed on a separate layer and the plurality of photo transmitters 314 are formed on a separate layer. Further, in such implementation, the layer having the plurality of second sensors 316 may be retrofitted in the existing display screens, without departing from the scope of the disclosure.

Figure 4:
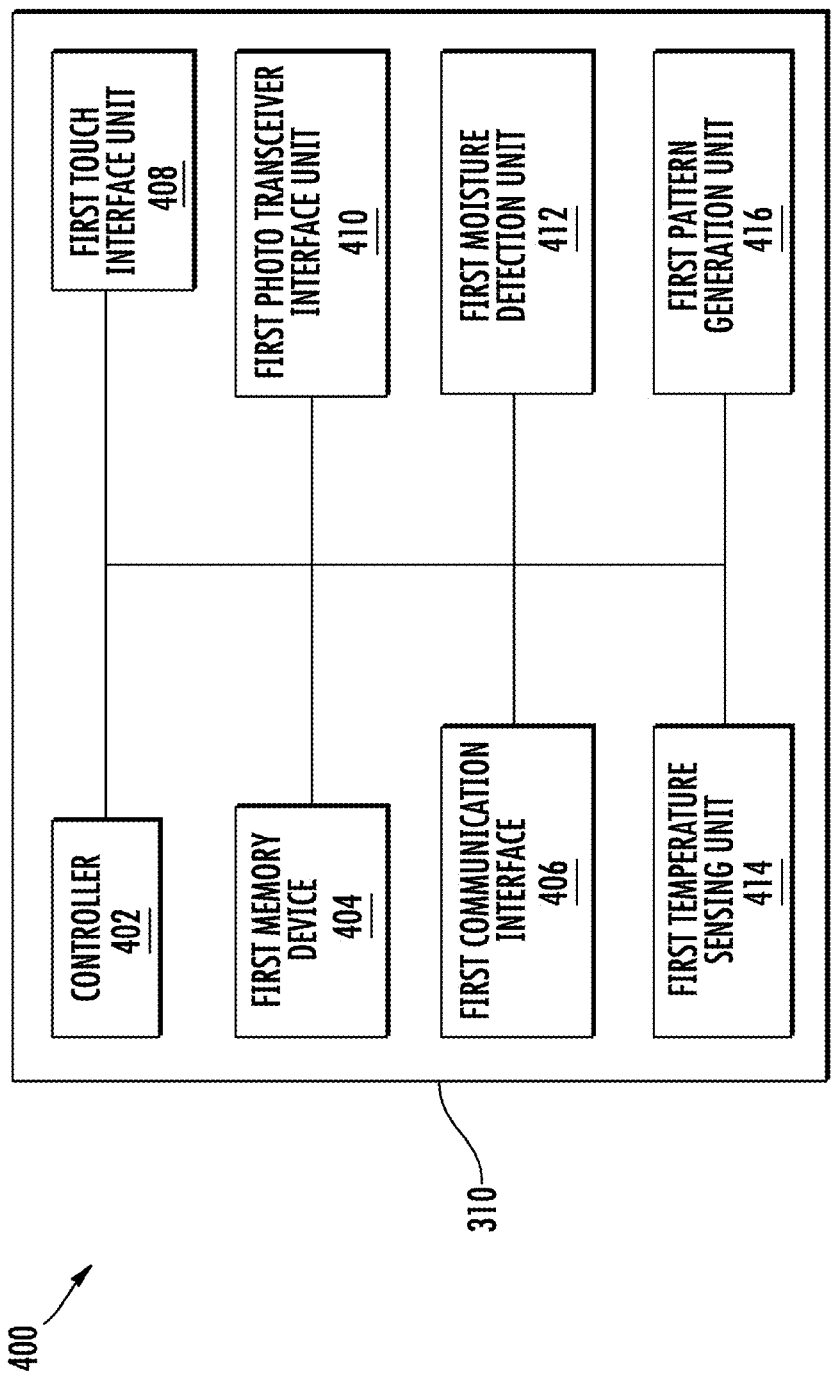
FIG. 4 illustrates a block diagram of a control system, according to one or more embodiments described herein.

FIG. 4 illustrates a block diagram 400 of the control system 310, according to one or more embodiments described herein. The control system 310 includes a controller 402, a first memory device 404, a first communication interface 406, a first touch interface unit 408, a first photo transceiver interface unit 410, a first moisture detection unit 412, a first temperature sensing unit 414, and a first pattern generation unit 416.

The controller 402 may be embodied as means including one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an application specific integrated circuit (ASIC) or field programmable gate array (FPGA), or some combination thereof. Accordingly, although illustrated in FIG. 4 as a single controller, in an embodiment, the controller 402 may include a plurality of controllers and signal processing modules. The plurality of controllers may be embodied on a single electronic device or may be distributed across a plurality of electronic devices collectively configured to function as the circuitry of the display screen 110. The plurality of controllers may be in operative communication with each other and may be collectively configured to perform one or more functionalities of the circuitry of the display screen 110, as described herein. In an example embodiment, the controller 402 may be configured to execute instructions stored in the first memory device 404 or otherwise accessible to the controller 402. These instructions, when executed by the controller 402, may cause the circuitry of the display screen 110 to perform one or more of the functionalities, as described herein.

Whether configured by hardware, firmware/software methods, or by a combination thereof, the controller 402 may include an entity capable of performing operations according to embodiments of the present disclosure while configured accordingly. Thus, for example, when the controller 402 is embodied as an ASIC, FPGA or the like, the controller 402 may include specifically configured hardware for conducting one or more operations described herein. Alternatively, as another example, when the controller 402 is embodied as an executor of instructions, such as may be stored in the first memory device 404, the instructions may specifically configure the controller 402 to perform one or more algorithms and operations described herein.

Thus, the controller 402 used herein may refer to a programmable microprocessor, microcomputer or multiple processor chip or chips that can be configured by software instructions (applications) to perform a variety of functions, including the functions of the various embodiments described above. In some devices, multiple processors may be provided dedicated to wireless communication functions and one processor dedicated to running other applications. Software applications may be stored in the internal memory before they are accessed and loaded into the processors. The processors may include internal memory sufficient to store the application software instructions. In many devices, the internal memory may be a volatile or nonvolatile memory, such as flash memory, or a mixture of both. The memory can also be located internal to another computing resource (e.g., enabling computer readable instructions to be downloaded over the Internet or another wired or wireless connection).

Figure 5:
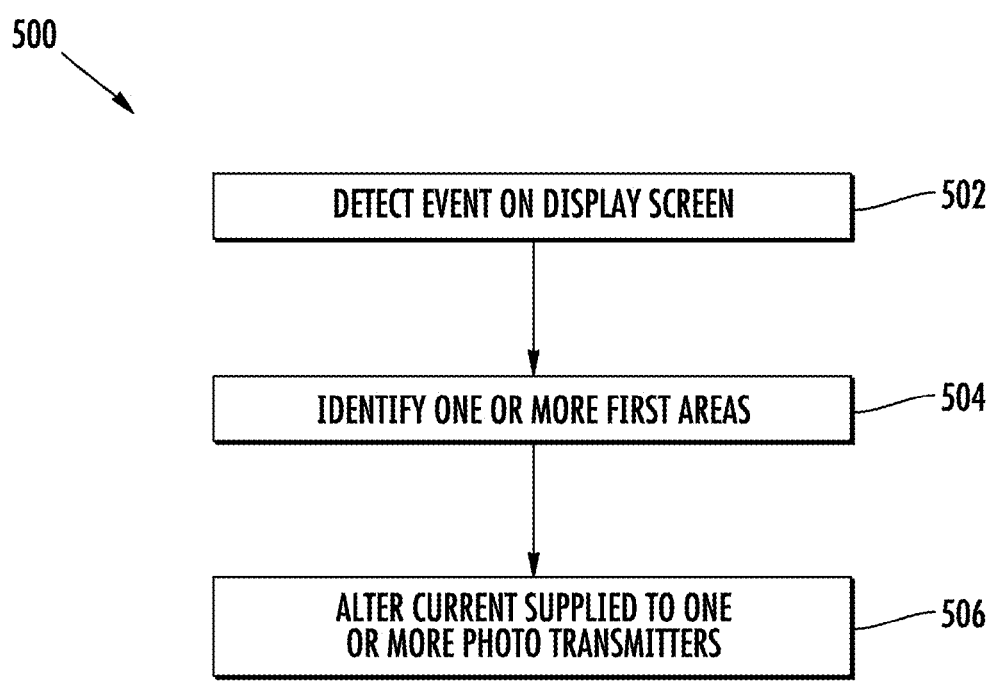
FIG. 5 illustrates a flowchart of a method for operating the display screen, according to one or more embodiments described herein.

In an example embodiment, the controller 402 may be configured to detect an event on the display screen 110, as is further described in FIG. 5. In an example embodiment, the event may correspond to at least one of an external phenomenon or an internal phenomenon that may be detected by the controller 402. Some examples of the event may include, but are not limited to, detection of moisture accumulation on the display screen 110 (described later in conjunction with FIG. 6), a temperature of the ambient environment around the display screen 110 satisfying (e.g. being below) a temperature threshold (described later in conjunction with FIGS. 11, 15, and 17), display of a predetermined content on the display screen 110 (described later in conjunction with FIG. 20), reception of a touch input on the display screen 110 (described later in conjunction with FIG. 14). In an example embodiment, the temperature threshold may correspond to a temperature value below which there is a high likelihood of moisture accumulation on the display screen 110. In an example embodiment, the predetermined content may correspond to at least one of a graphics, a text, an icon, and/or the like that is displayable on the display screen 110.

The first memory device 404 may include suitable logic, circuitry, and/or interfaces that are adapted to store a set of instructions that is executable by the controller 402 to perform predetermined operations. Some of the memory implementations include, but are not limited to, a hard disk, random access memory, cache memory, read only memory (ROM), erasable programmable read-only memory (EPROM) & electrically erasable programmable read-only memory (EEPROM), flash memory, magnetic cassettes, magnetic tape, magnetic disk storage or other magnetic storage devices, a compact disc read only memory (CD-ROM), digital versatile disc read only memory (DVD-ROM), an optical disc, circuitry configured to store information, or some combination thereof. In an embodiment, the first memory device 404 may be integrated with the controller 402 on a single chip, without departing from the scope of the disclosure. In an example embodiment, the first memory device 404 may be configured to store data pertaining to the plurality of photo transmitters 314, the plurality of second sensors 316, the plurality of first sensors 318. In an example embodiment, the data pertaining to the plurality of photo transmitters 314, the plurality of second sensors 316, the plurality of first sensors 318 may include, but not limited to, a location of each photo transmitter of the plurality of photo transmitters, each first sensor of the plurality of first sensors, and each second sensor of the plurality of second sensors. Further, the data includes unique address associated with each photo transmitter of the plurality of photo transmitters, each first sensor of the plurality of first sensors, and each second sensor of the plurality of second sensors. In an example embodiment, the unique address may enable the controller 402 to individually control the plurality of first sensors, plurality of photo transmitters, and a plurality of second sensors. For example, based on the unique address, the controller 402 may be able to uniquely identify which of the plurality of second sensors has sent the second signal (corresponding to the detected intensity of light signal) to the controller 402. Similarly, the controller 402 may be able to uniquely identify which of the plurality of first sensors has sent the first signal corresponding to the reception of the touch input to the controller 402. of the information. Following example table illustrates example data pertaining to the plurality of photo transmitters 314:

TABLE 1

Location and unique address of plurality of photo transmitters 314

| Plurality of photo transmitters 314 | Location on the display screen 110 | Unique address |
|---|---|---|
| Photo transmitter 314a | (5, 4) | 1010101 |
| Photo transmitter 314b | (10, 20) | 1010111 |

In some examples, the data pertaining to the plurality of second sensors 316 may also include information pertaining to the one or more measurement areas associated with each of the plurality of second sensors 316 (in addition to the location and unique address associated with each of the plurality of second sensors 316). Following table illustrates an example data pertaining to the plurality of second sensors:

Similarly, the first memory device 404 includes the location information and address of the plurality of first sensors 318 (i.e., the first sensors in the touch panel 304).

The first communication interface 406 may correspond to a communication interface that may facilitate transmission and reception of messages and data to and from various components of the display screen 110. For example, the first communication interface 406 is communicatively coupled with the control system 310. Examples of the first communication interface 406 may include, but are not limited to, an antenna, an Ethernet port, a USB port, a serial port, or any other port that can be adapted to receive and transmit data. The first communication interface 406 transmits and receives data and/or messages in accordance with the various communication protocols, such as, I2C, TCP/IP, UDP, and 2G, 3G, 4G or 5G communication protocols.

The first touch interface unit 408 may include suitable logic or circuitry that may enable the first touch interface unit 408 to communicate with the touch panel 304. For example, the first touch interface unit 408 may be configured to receive a first signal from each first sensor of the plurality of first sensors 318 in the touch panel 304. Further, the first touch interface unit 408 may be configured to determine the location of the touch input on the display screen 110, as is further described in conjunction with FIG. 14. The first touch interface unit 408 may be implemented using one or more technologies, such as, but not limited to, FPGA, ASIC, and the like.

The first photo transceiver interface unit 410 may include suitable logic or circuitry that may enable the first photo transceiver interface unit 410 to communicate with the photo transceiver layer 302. For example, the first photo transceiver interface unit 410 may be configured to cause the photo transceiver layer 302 to generate light signal, as is further described in conjunction with FIG. 6. In an example embodiment, the first photo transceiver interface unit 410 may include one or more driver circuits that may facilitate communication between the plurality of photo transmitters 314 and the first photo transceiver interface unit 410. For example, through the one or more driver circuits, the first photo transceiver interface unit 410 may be configured to control the electric current supplied to each of the plurality of photo transmitters 314. As discussed above, each photo transmitter of the plurality of photo transmitters 314 is uniquely identifiable (based on addresses stored in the first memory device 404). Therefore, based on the stored addresses, the first photo transceiver interface unit 410 may individually control each of the plurality of photo transmitters 314. For example, the first photo transceiver interface unit 410 may be configured to alter the electric current supplied to the photo transmitter 314a without affecting the electric current supplied to the other photos transmitters of the plurality of photo transmitters 314. In some example

TABLE 2

Location, unique address, and corresponding measurement area associated with the plurality of second sensors

Figure 6:
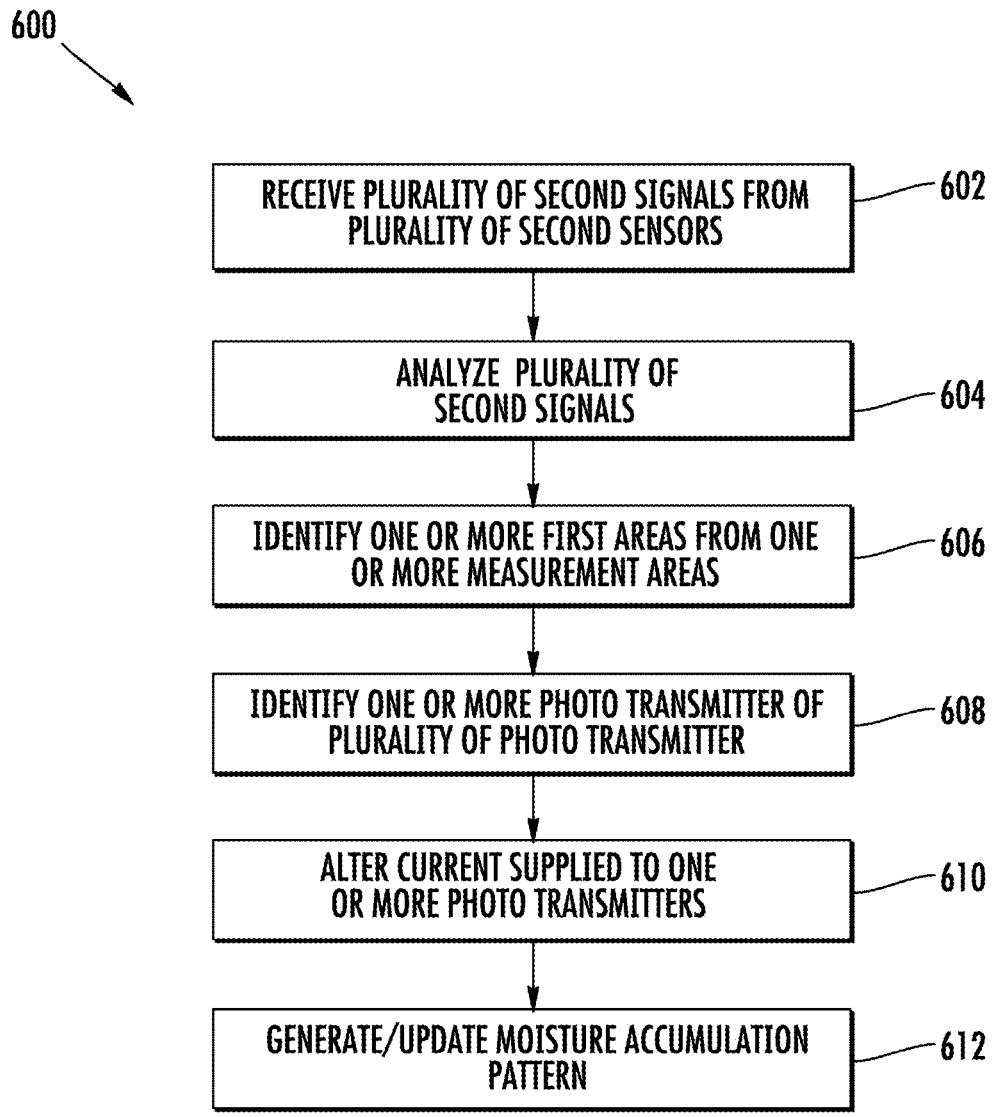
FIG. 6 illustrates a flowchart of a method for operating the display screen associated with detection of an event based on moisture accumulation on the display screen, according to one or more embodiments described herein.

| Plurality of second sensor 316 | Location on the display screen 110 | Unique address | Measurement areas |
|---|---|---|---|
| second sensor-1 | (2, 3) | 000101 | (0, 0)(3, 3)(0, 3)(3, 0) |
| second sensor-2 | (15, 20) | 101010 | (13, 13)(20, 20)(13, 20)(20, 13) | embodiments, the first photo transceiver interface unit 410 may be configured to receive the plurality of second signals from the plurality of second sensors 316, as is further described in conjunction with FIG. 6. Further, the first photo transceiver interface unit 410 may be configured to analyze the plurality of second signals to determine a transmissivity/reflectivity measurement of the one or more measurement areas on the display screen 110, as is further described in conjunction with FIG. 6. In an example embodiment, the first photo transceiver interface unit 410 may be further configured to store the transmissivity/reflectivity measurement of the one or more measurement areas of the display screen 110 in the first memory device 404. In some examples, the first photo transceiver interface unit 410 may be further configured to alter the electric current supplied to one or more photo transmitters of the plurality of photo transmitters 314, as is further described in conjunction with FIG. 6. The first photo transceiver interface unit 410 may be implemented using one or more technologies, such as, but not limited to, FPGA, ASIC, and the like.

The first moisture detection unit 412 may include suitable logic and/or circuitry that may enable the first moisture detection unit 412 to detect moisture accumulation on the display screen 110, as is further described in conjunction with FIG. 6. For example, the first moisture detection unit 412 may be further configured to identify one or more first areas of the one or more measurement areas on the display screen 110, as is further described in conjunction with FIG. 8. In an example embodiment, the one or more first areas may correspond to measurement areas on the display screen 110 where moisture detection unit 412 has detected moisture accumulation. The first moisture detection unit 412 may be implemented using one or more technologies, such as, but not limited to, FPGA, ASIC, and the like.

The first temperature sensing unit 414 may include suitable logic (not shown) and/or circuitry that may enable first temperature sensing unit 414 to cause a temperature sensor in the display screen 110 to determine the temperature of the ambient environment around the display screen 110. For example, the temperature sensor may be configured to determine the temperature of the ambient environment around the electronic device 102, where the display screen 110 is installed. In some examples, the temperature sensor may be positioned on the glass substrate layer 306. However, the scope of the disclosure is not limited to the temperature sensor being positioned on the glass substrate layer 306. In an example embodiment, the temperature sensor may be positioned in the electronic device 102 and may be communicatively coupled to the control system 310. In an example embodiment, the temperature sensor may correspond to at least one of a thermocouple, a thermistor, or an infrared sensor that may be configured to determine the temperature of the ambient environment. In an example embodiment, the first temperature sensing unit 414 may be further configured to store the determined temperature in the first memory device 404. The first temperature sensing unit 414 may be implemented using one or more technologies, such as, but not limited to, FPGA, ASIC, and the like.

The pattern generation unit 416 may include suitable logic and/or circuitry that may enable the pattern generation unit 416 to generate a moisture accumulation pattern based on the identification of the one or more first areas. The generation of the moisture accumulation pattern is described later in conjunction with FIG. 6. Further, the pattern generation unit 416 may be configured to generate a display screen historical usage pattern based on the touch input detected by the first touch interface unit 408. The generation of the display screen usage pattern is described later in conjunction with FIG. 14. The pattern generation unit 416 may be implemented using one or more technologies, such as, but not limited to, FPGA, ASIC, and the like.

FIGS. 5, 6, 8, 9, 11, 13-15, and 17-20 illustrate example flowcharts of the operations performed by an apparatus, such as the display screen 110 and the electronic device 102 of FIG. 1 in accordance with example embodiments of the present invention. It will be understood that each block of the flowcharts, and combinations of blocks in the flowcharts, may be implemented by various means, such as hardware, firmware, one or more processors, circuitry and/or other devices associated with execution of software including one or more computer program instructions. For example, one or more of the procedures described above may be embodied by computer program instructions. In this regard, the computer program instructions which embody the procedures described above may be stored by a memory of an apparatus employing an embodiment of the present invention and executed by a processor in the apparatus. As will be appreciated, any such computer program instructions may be loaded onto a computer or other programmable apparatus (e.g., hardware) to produce a machine, such that the resulting computer or other programmable apparatus provides for implementation of the functions specified in the flowcharts' block(s). These computer program instructions may also be stored in a non-transitory computer-readable storage memory that may direct a computer or other programmable apparatus to function in a particular manner, such that the instructions stored in the computer-readable storage memory produce an article of manufacture, the execution of which implements the function specified in the flowcharts' block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowcharts' block(s). As such, the operations of each of FIGS. 5, 6, 8, 9, 11, 13-15, and 17-20, when executed, convert a computer or processing circuitry into a particular machine configured to perform an example embodiment of the present invention. Accordingly, the operations of each of FIGS. 5, 6, 8, 9, 11, 13-15, and 17-20 define an algorithm for configuring a computer or processor, to perform an example embodiment. In some cases, a general purpose computer may be provided with an instance of the processor which performs the algorithm of FIG. 5, 6, 8, 9, 11, 13-15, or 17-20 to transform the general purpose computer into a particular machine configured to perform an example embodiment.

Accordingly, blocks of the flowchart support combinations of means for performing the specified functions and combinations of operations for performing the specified functions. It will also be understood that one or more blocks of the flowcharts, and combinations of blocks in the flowchart, can be implemented by special purpose hardware-based computer systems which perform the specified functions, or combinations of special purpose hardware and computer instructions.

FIG. 5 illustrates a flowchart 500 of a method for operating the display screen 110, according to one or more embodiments described herein.

At step 502, the display screen 110 includes means, such as the control system 310, the controller 402, and/or the like, for detecting an event on the display screen 110. As discussed, the event may correspond to at least one of detection of moisture accumulation on the display screen 110, the temperature of the ambient environment around the display screen 110 satisfying a temperature threshold, reception of the touch input on the display screen 110, and/or the display of the predetermined content on the display screen 110. The detection of the moisture accumulation is described later in conjunction with FIG. 6. Further, the reception of the touch input is described later in conjunction with FIG. 14. Further, the detection of the temperature of the ambient environment satisfying the temperature threshold is described later in conjunction with FIGS. 11, 15, and 17. Furthermore, the display of the predetermined content is described later in conjunction with FIG. 20.

At step 504, the display screen 110 includes means, such as the control system 310, the controller 402, the first moisture detection unit 412, and/or the like, for identifying the one or more first areas from the one or more measurement areas based on the detected event. The identification of the one or more first areas is described later in conjunction with FIGS. 6-21

At step 506, the display screen 110 includes means, such as the control system 310, the controller 402, the first photo transceiver interface unit 410, and/or the like, for altering the electric current supplied to the one or more photo transmitters associated with the one or more first areas. The altering of the electric current supplied to the one or more photo transmitters is described later in conjunction with FIG. 6.

FIG. 6 illustrates a flowchart 600 of a method for operating the display screen 110 based on detection of event of moisture accumulation on the display screen 110, according to one or more embodiments described herein.

At step 602, the display screen 110 includes means, such as the control system 310, the controller 402, the first photo transceiver interface unit 410, and/or the like, for receiving the plurality of second signals from the plurality of second sensors 316. As discussed above, each second signal of the plurality of second signals corresponds to the voltage signal that is indicative of the transmissivity/reflectivity measurement of the glass substrate layer 306. In an example embodiment, the one or more characteristics of the plurality of second signals (such as the amplitude and the frequency) are indicative of the intensity of the light signal detected by the plurality of second sensors 316. Because the intensity of the light signal detected by the plurality of second sensors is dependent on the transmissivity/reflectivity of the one or more respective measurement areas on the display screen 110, therefore, the measurement of the one or more characteristics of the plurality of second signals corresponds to the transmissivity/reflectivity measurement of the one or more respective measurement areas. For example, variation in the measurement of the one or more characteristics of the plurality of second signals may be indicative of the variations in the transmissivity/reflectivity measurement of the one or more respective measurement areas on the display screen 110. The variations in the plurality of second signals are further described in conjunction with FIG. 7.

Figure 7:
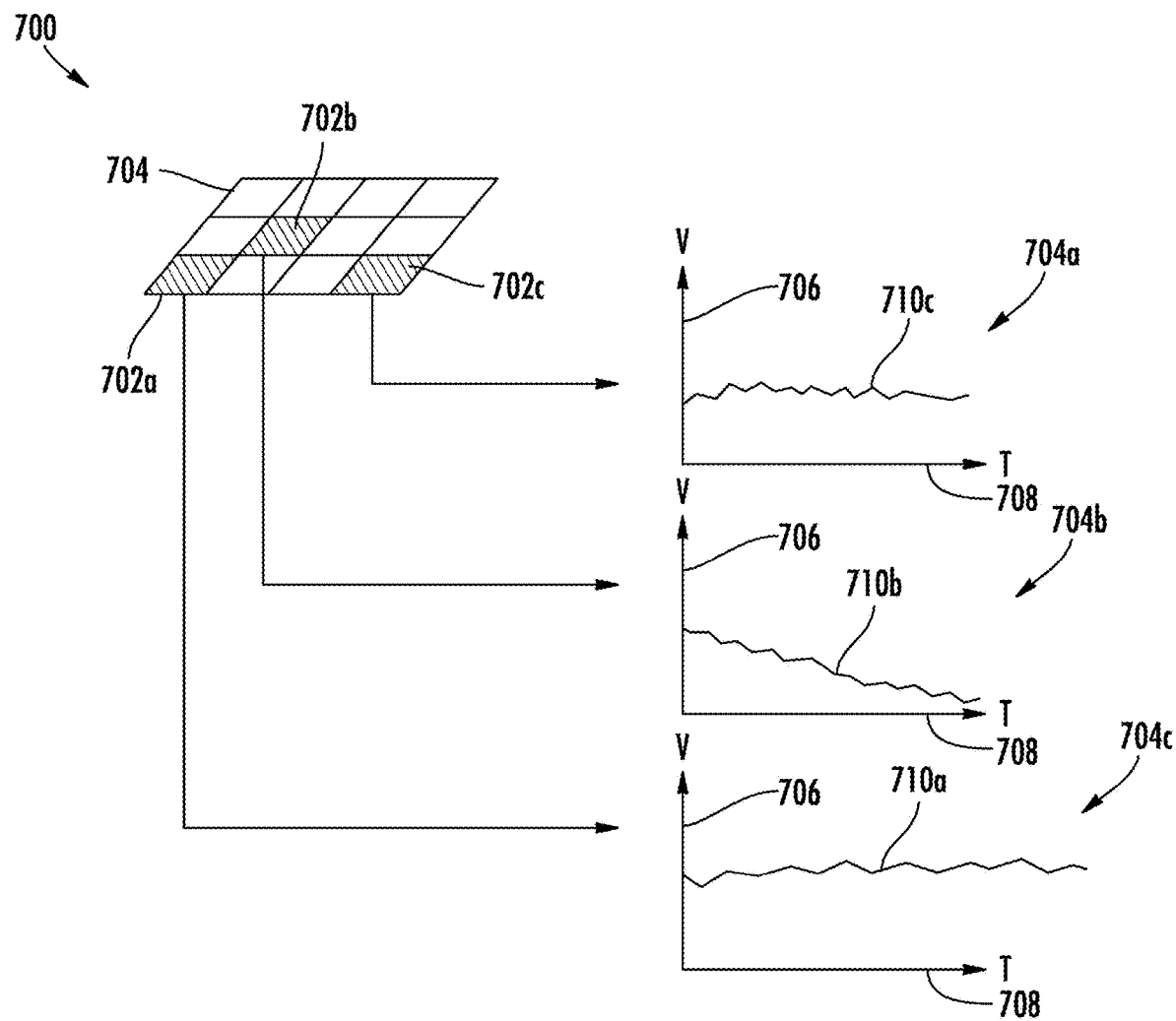
FIG. 7 is an example illustration depicting a plurality of second signals and one or more respective measurement areas on the display screen, according to one or more embodiments described herein.

FIG. 7 is an example illustration 700 depicting the plurality of second signals and the one or more respective measurement areas on the display screen 110, according to one or more embodiments described herein. The illustration 700 depicts that the display screen 110 includes a measurement area 702a, a measurement area 702b, and a measurement area 702c. In an example embodiment, as discussed above, each of the one or more measurement areas is defined as the portion on the display screen through which a second sensor of the plurality of second sensors 316 receives and detects the light signal. Therefore, each of the measurement area 702a, the measurement area 702b, and the measurement area 702c, has an associated second sensor of the plurality of second sensors 316. Further, the second sensors associated with the measurement areas 702a, 702b, and 702c generate the second signals indicative of the transmissivity/reflectivity measurement of the respective measurement areas 702a, 702b, and 702c. For example, the second sensor associated with the measurement area 702a generates the second signal, depicted by the graphical representation 704a. Similarly, the second sensors associated with the measurement areas 702b and 702c generate the second signals depicted by the graphical representations 704b and 704c, respectively. Each of the graphical representations 704a, 704b, and 704c has an X-axis (e.g., 708) and a Y-axis (e.g., 706). The X-axis (e.g., 708) may represent a time at which the first photo transceiver interface unit 410 receives the plurality of second signals. The Y-axis (e.g., 706) represents the amplitude of the plurality of second signals. Further, the graphical representations 704a, 704b, and 704c include curves 710a, 710b, and 710c, respectively. Each of the curves 710a, 710b, and 710c is representative of the variation in the amplitude of the second signals (represented by the graphical representations 704a, 704b, and 704c).

It can be observed that the amplitude of the curve 710b (depicting the second signal corresponding to the measurement area 702b) decreases as the time continues, and the amplitude of the curves 710a and 710c remains constant. The reducing amplitude of the curve 710b may be indicative of the variation in the transmissivity/reflectivity measurement of the measurement area 702b. For example, reducing amplitude of the curve 710b may depict a reducing transmissivity of the display screen 110. Further, because the amplitude of the curves 710a and 710c remain constant, the transmissivity/reflectivity measurement of the measurement areas 702a and 702c is constant.

In some examples, the variation in the transmissivity/reflectivity measurement of the measurement area 702b may be due to moisture accumulation in the measurement area 702b. In some examples, in an instance in which the moisture gets accumulated on the display screen 110, the transmissivity of the display screen 110 decreases while the reflectivity of the display screen 110 increases. Therefore, in some implementations, where the second signal corresponds to the reflectivity measurement, the amplitude of the second signal may depict an increase when the moisture gets accumulated on the display screen 110. Similarly, where the second signal corresponds to the transmissivity measurement, the amplitude of the second signal may depict a decrease (such as the curve 710b) when the moisture gets accumulated on the display screen 110.

The moisture accumulation may occur in certain environmental conditions such as environment temperature dropping to below zero degree Celsius. Because the transmissivity/reflectivity measurement of a measurement area of the one or more measurement areas varies upon moisture accumulation, by monitoring the transmissivity/reflectivity measure, the moisture accumulation on the display screen 110 may be detected, as is further described in the step 606 of FIG. 6. The variation in the transmissivity/reflectivity measurement of the measurement area 702b due to accumulation of the moisture is further illustrated in FIGS. 10A and 10B.

Referring back to FIG. 6, at step 604, the display screen 110 includes means, such as the control system 310, the controller 402, the first photo transceiver interface unit 410, and/or the like, for analyzing each second signal of the plurality of second signals to determine the measurement of the one or more characteristics of each second signal of the plurality of second signals. As discussed above, the one or more characteristics of each of the plurality of second signals include the amplitude of the second signal and the frequency of the second signal.

To determine the amplitude measurement of the second signal of the plurality of second signals, the first photo transceiver interface unit 410 may be configured to determine an average amplitude of the second signals (received during the time duration (e.g., depicted by the X-axis 708)). Thereafter, the first photo transceiver interface unit 410 may determine the determined average amplitude as the amplitude measurement of the second signal. In an alternative embodiment, the first photo transceiver interface unit 410 may determine the amplitude measurement of the second signal based on the real time or current amplitude measurement of the second signal. For instance, the amplitude measurement of the second signal at a time instance $t_1$ is $V_1$ and the amplitude measurement of the second signal at a current time instant is $V_2$, the first photo transceiver interface unit 410 may determine the amplitude $V_2$ as the amplitude measurement of the second signal.

To determine the frequency measurement of the second signal, the first photo transceiver interface unit 410 may be configured to transform the second signal to a frequency domain second signal using one or more signal processing techniques such as, but not limited to, DFT, DTFT, and/or the like. In some examples, the frequency domain second signal may be deterministic of various frequencies present in the second signal. Thereafter, the first photo transceiver interface unit 410 may determine the frequency measurement of the second signal based on an average of the various frequencies present in the second signal. In an example embodiment, the first photo transceiver interface unit 410 may be configured to analyze the other second signals of the plurality of second signals in a similar manner to determine the measurement of the one or more characteristics of the other second signals.

As discussed above, the measurement of the one or more characteristics of the second signal (i.e., the amplitude measurement and the frequency measurement) corresponds to the transmissivity/reflectivity measurement of the respective measurement area on the display screen 110. For example, the amplitude measurement of the second signal may correspond to the transmissivity/reflectivity measurement of the respective measurement area. In another example, the frequency measurement of the second signal may correspond to the transmissivity/reflectivity measurement of the respective measurement area. In yet another example, a combination of the amplitude measurement and the frequency measurement of the second signal corresponds to the transmissivity/reflectivity measurement of the respective measurement area.

At step 606, the display screen 110 includes means, such as the control system 310, the controller 402, the first moisture detection unit 412, and/or the like, for identifying the one or more first areas of the one or more measurement areas. In some examples, the one or more first areas may correspond to measurement areas where the moisture may have accumulated. The identification of the one or more first areas is further described in conjunction with FIG. 8.

Figure 8:
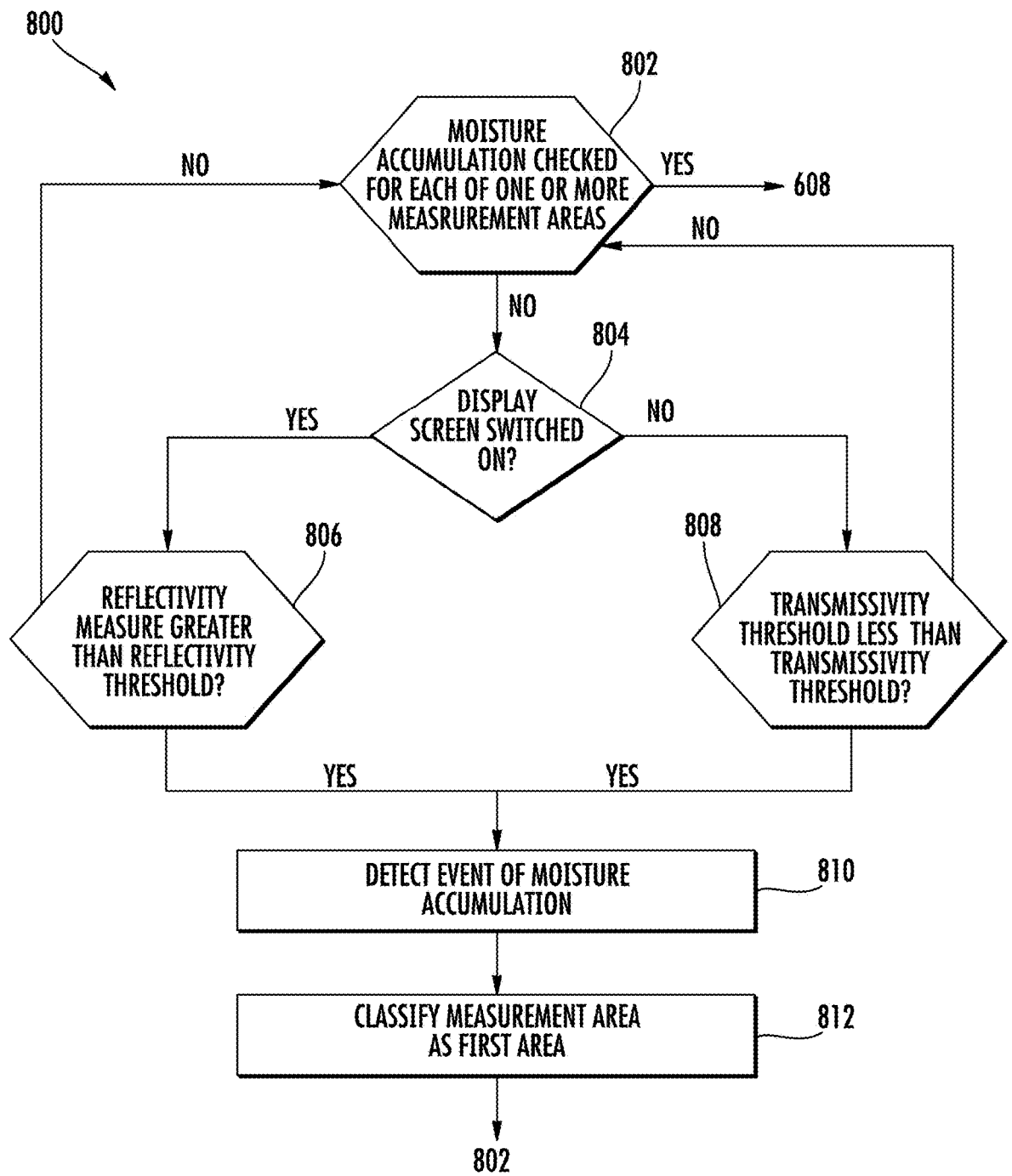
FIG. 8 illustrates a flowchart of a method for identifying one or more first areas of the one or more measurement areas, according to one or more embodiments described herein.

FIG. 8 illustrates a flowchart 800 of a method for identifying the one or more first areas of the one or more measurement areas, according to one or more embodiments described herein.

At step 802, the display screen 110 includes means, such as the control system 310, the controller 402, the first moisture detection unit 412, and/or the like, for determining whether each of the one or more measurement areas has been checked for moisture accumulation. In an example embodiment, if the first moisture detection unit 412 determines that the moisture accumulation has been checked for each of the one or more measurements areas, the first moisture detection unit 412 may be configured to perform the step 608. However, if the first moisture detection unit 412 determines that not each of the one or more measurement areas has been checked for moisture accumulation, the first moisture detection unit 412 may be configured to perform the step 804.

At step 804, the display screen 110 includes means, such as the control system 310, the controller 402, the first photo transceiver interface unit 410, the first moisture detection unit 412, and/or the like, for determining whether the display screen 110 is switch ON. As discussed above, the operator 108 of the electronic device 102 may provide input to switch ON the display screen 110 or switch OFF the display screen 110. Accordingly, based at least on the reception of the input from the operator 108, the first photo transceiver interface unit 410 may be configured to determine whether the display screen 110 is switched ON. In alternative embodiment, the first photo transceiver interface unit 410 may be configured to determine whether the display screen 110 has been switched ON based on whether the electric current is being supplied to each of the plurality of photo transmitters 314. If the first photo transceiver interface unit 410 determines that the display screen 110 is switched ON, the controller 402 may be configured to perform the step 806.

At step 806, the display screen 110 includes means, such as the control system 310, the controller 402, the first moisture detection unit 412, and/or the like, for determining whether the reflectivity measurement associated with a measurement area of the one or more measurement area satisfies (e.g. is greater than) a reflectivity threshold. In an example embodiment, because the display screen 110 is switched ON, the plurality of photo transmitter 314 may be configured to generate the light signals. Major portion of the generated light signal is generally expected to pass through the glass substrate layer 306. However, in scenarios, where the moisture has accumulated on the display screen 110, some portion of the light signal may get reflected back towards the photo transceiver layer 302. Further, the plurality second sensors may detect the reflected portion of the light signals. Accordingly, the amplitude of the plurality of second signals will depict an increase (because of the detection of the reflected portion of the light signal). Further, the amplitude of the second signal may be indicative of the reflectivity measurement of the display screen 110. Accordingly, when the display screen 110 is switched ON, increase in the amplitude of the plurality of second signals may depict moisture accumulation. Hence, at step 806, the first moisture detection unit 412 determines whether the reflectivity measurement associated with the measurement area satisfies (e.g. is greater than) the reflectivity threshold.

As discussed above, the reflectivity measurement of the measurement area corresponds to the measurement of the one or more characteristics of the second signal generated by the second sensor associated with the measurement area. In some examples, the reflectivity threshold may correspond to a first threshold measurement of the one or more characteristics of the second signal. Therefore, in other words, the first moisture detection unit 412, at step 804, may determine whether the measurement of the one or more characteristics of the second signal (corresponding to the measurement area) satisfies (e.g. is greater than) the first threshold measurement of the one or more characteristics. The determination of the step 806 is further described in conjunction with FIG. 9.

Figure 9:
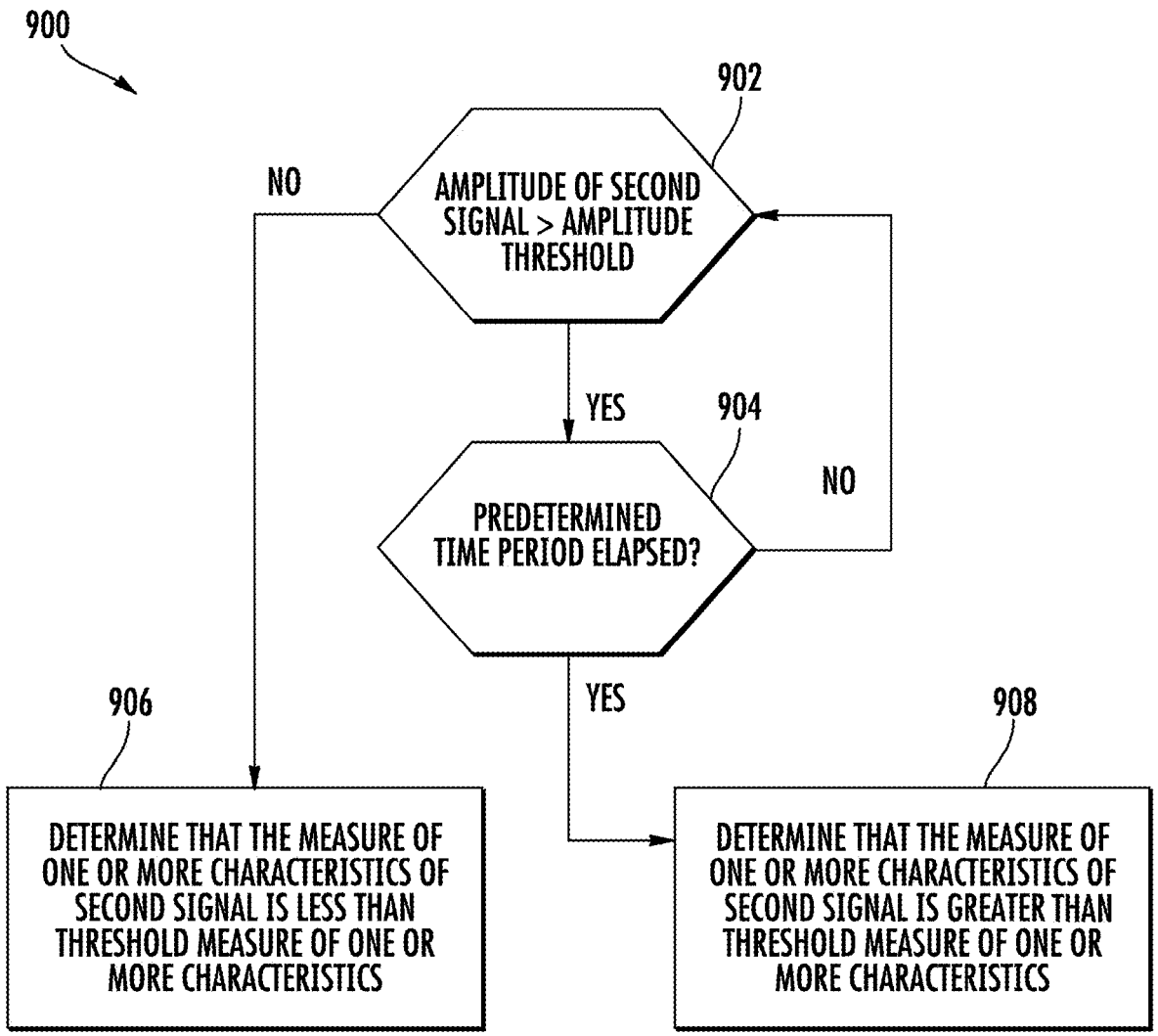
FIG. 9 illustrates a flowchart of a method for determining whether the reflectivity measurement associated with the measurement area satisfies a reflectivity threshold.

FIG. 9 illustrates a flowchart 900 of a method for determining whether the reflectivity measurement associated with the measurement area satisfies (e.g. is greater than) the reflectivity threshold.

At step 902, the display screen 110 includes means, such as the control system 310, the controller 402, the first moisture detection unit 412, and/or the like, for determining whether the amplitude of the second signal satisfies (e.g., greater than) a first amplitude threshold (i.e., the threshold measurement of the one or more characteristics). In an example embodiment, the first amplitude threshold may correspond to the first threshold measurement of the one or more characteristics. If the first moisture detection unit 412 determines that the amplitude of the second signal does not satisfy (e.g., is less than) the first amplitude threshold, the first moisture detection unit 412 may be configured to perform the step 906. However, if the first moisture detection unit 412 determines that the amplitude measurement of the second signal satisfies (e.g. is greater than) the first amplitude threshold, the first moisture detection unit 412 may be configured to perform the step 904.

At step 906, the display screen 110 includes means, such as the control system 310, the controller 402, the first moisture detection unit 412, and/or the like, for determining that the measurement of the one or more characteristics of the second signal is does not satisfy (e.g., less than) the first threshold measurement of the one or more characteristics.

At step 904, the display screen 110 includes means, such as the control system 310, the controller 402, the first moisture detection unit 412, and/or the like, for determining whether a predetermined time period has elapsed since a time instant at which the amplitude measurement is determined to satisfy (e.g. is greater than) the first amplitude threshold. If the first moisture detection unit 412 determines that the predetermined time period has elapsed, the first moisture detection unit 412 may be configured to perform the step 908. However, if the first moisture detection unit 412 determines that the predetermined time period has not elapsed, the first moisture detection unit 412 may be configured to repeat the step 902. By performing the step 904, the first moisture detection unit 412 checks whether the amplitude of the second signal satisfies (e.g. is greater than) the first amplitude threshold for the predetermined time period. Accordingly, by performing the step 904, the first moisture detection unit 412 avoids false determination of the amplitude of the second signal satisfying (e.g. greater than) the first amplitude threshold. For example, due to noise in the second signal, the amplitude measurement at a time instant $t_1$ satisfies (e.g. is greater than) the first amplitude threshold momentarily. However, in the subsequent time instant $t_2$, the amplitude measurement does not satisfy (e.g., less than) the first amplitude threshold. Therefore, had the moisture detection unit 412 not performed the step 904, the moisture detection unit 412 would have, incorrectly, performed the step 908.

At step 908, the display screen 110 includes means, such as the control system 310, the controller 402, the first moisture detection unit 412, and/or the like, for determining that the measurement of the one or more characteristics of the second signal satisfies (e.g. is greater than) the first threshold measurement of the one or more characteristics.

In some examples, the scope of the disclosure is not limited to only comparing the amplitude of the second signal with the first amplitude threshold to determine whether the measurement of the one or more characteristics satisfies (e.g. is greater than) the first threshold measurement of the one or more characteristics. In alternative embodiment, the first moisture detection unit 412 may be configured to compare the frequency measurement of the second signal with a first frequency threshold to determine whether the measurement of the one or more characteristics satisfies (e.g. is greater than) the first threshold measurement of the one or more characteristics. In such an implementation, the first frequency threshold corresponds to the first threshold measurement of the one or more characteristics. In yet another embodiment, the first moisture detection unit 412 may be configured to compare both the amplitude measurement and the frequency measurement of the second signal with the first amplitude threshold and the first frequency threshold, respectively, to determine whether the measurement of the one or more characteristics satisfies (e.g. is greater than) the first threshold measurement of the one or more characteristics. In such an embodiment, the first moisture detection unit 412 may determine that the measurement of the one or more characteristics satisfies (e.g. is greater than) the first threshold measurement of the one or more characteristics only when both the amplitude measurement and the frequency measurement of the second signal satisfy (e.g. is greater than) the first amplitude threshold and the first frequency threshold, respectively. Further, in such an embodiment, both the first amplitude threshold and the first frequency threshold correspond to the first measurement threshold of the one or more characteristics.

Referring back to the step 806, if the first moisture detection unit 412 determines that the measurement of the one or more characteristics of the second signal satisfies (e.g. is greater than) the first threshold measurement of the one or more characteristics, the first moisture detection unit 412 may determine the reflectivity measurement of the measurement area satisfies (e.g. is greater than) the reflectivity threshold. Accordingly, the first moisture detection unit 412 may be configured to perform the step 810. However, if the first moisture detection unit 412 determines that the measurement of the one or more characteristics of the second signal is does not satisfy (e.g., less than) the first threshold measurement of the one or more characteristics, the first moisture detection unit 412 may determine the reflectivity measurement of the measurement area is does not satisfy (e.g., less than) the reflectivity threshold. Accordingly, the first moisture detection unit 412 may be configured to repeat the step 802.

Referring back to step 804, if the first photo transceiver interface unit 410 determines that the display screen 110 is switched OFF, the controller 402 may be configured to perform the step 808. At step 808, the display screen 110 includes means, such as the control system 310, the controller 402, the first moisture detection unit 412, and/or the like, for determining whether the transmissivity measurement associated with the measurement area of the one or more measurement area satisfy (e.g., less than) the transmissivity threshold. In an example embodiment, because the display screen 110 is switched OFF, the plurality of photo transmitter 314 may not be generating the light signals. The plurality of second sensors 316 may be receiving light signals from the ambient environment around the display screen 110. Major portion of the light signal from the ambient environment generally pass through the glass substrate layer 306 and is detected by the plurality of second sensors 316. However, in scenarios, where the moisture has accumulated on the display screen 110, the light signals from the ambient environment are not able to pass through the glass substrate layer 306. This, in some examples, result in a dip in the amplitude of the plurality of second signals generated by the second sensors 316. Therefore, when the display screen 110 is switched OFF, the dip in the amplitude of the plurality of second signals may depict moisture accumulation. Hence, at step 808, the first moisture detection unit 412 determines whether the transmissivity measurement associated with the measurement area satisfies (e.g., less than) the transmissivity threshold.

In some examples, the first moisture detection unit 412 may determine whether the amplitude measurement of the second signal satisfies (e.g., less than) a second amplitude threshold. If the first moisture detection unit 412 determines that the amplitude measurement of the second signal satisfies (e.g., less than) the second amplitude threshold, the first moisture detection unit 412 may determines that the measurement of the one or more characteristics satisfies (e.g., less than) a second threshold measurement of the one or more characteristics. In such an implementation, the second amplitude threshold corresponds to the second threshold measurement of the one or more characteristics. In alternative embodiment, the first moisture detection unit 412 may be configured to determine whether the frequency measurement of the second signal satisfies (e.g., less than) a second frequency threshold, to determine whether the measurement of the one or more characteristics satisfies (e.g., less than) the threshold measurement of the one or more characteristics. In such an implementation, the second frequency threshold corresponds to the second threshold measurement of the one or more characteristics. In yet another embodiment, the first moisture detection unit 412 may be configured to determine whether both the amplitude measurement and the frequency measurement of the second signal satisfy (e.g., less than) the second amplitude threshold and the second frequency threshold, respectively, to determine whether the measurement of the one or more characteristics satisfies (e.g., less than) the second threshold measurement of the one or more characteristics. In such an embodiment, the first moisture detection unit 412 may determine that the measurement of the one or more characteristics satisfies (e.g., less than) the second threshold measurement of the one or more characteristics only when both the amplitude measurement and the frequency measurement of the second signal satisfy (e.g., less than) the second amplitude threshold and the second frequency threshold, respectively.

In an example embodiment, the first threshold measurement of the one or more characteristics is different from the second threshold measurement of the one or more characteristics. For example, the value of the first amplitude threshold is different from the second amplitude threshold. In an example embodiment, if the amplitude measurement of the second signal is between the first amplitude threshold and the second amplitude threshold, the moisture detection unit 412 may determine that no moisture as accumulated on the display screen 110. In an alternative embodiment, the first threshold measurement of the one or more characteristics is equal to the second threshold measurement of the one or more characteristics, without departing from the scope of the disclosure. For example, the value of the first amplitude threshold is equal to the second amplitude threshold.

In an example embodiment, if at step 808, the first moisture detection unit 412 determines that the transmissivity measurement associated with the measurement area satisfies (e.g., less than) the second transmissivity threshold, the first moisture detection unit 412 may be configured to perform the step 810. However, if the first moisture detection unit 412 determines that the transmissivity measurement associated with the measurement area does not satisfy (e.g., greater than) the transmissivity threshold, the first moisture detection unit 412 may be configured to repeat the step 802.

At the step 810, the display screen 110 includes means, such as the control system 310, the controller 402, the first moisture detection unit 412, and/or the like, for detecting the event of moisture accumulation in the measurement area. Accordingly, at step 812, the display screen 110 includes means, such as the control system 310, the controller 402, the first moisture detection unit 412, and/or the like, for classifying the measurement area as the first area. Thereafter, the first moisture detection unit 412 may be configured to repeat the step 802.

In an example embodiment, the first moisture detection unit 412 may be configured to perform the method described in the flowchart 800 until the first moisture detection unit 412 checks each of the one or more measurement areas for moisture accumulation. After performing the method described in the flowchart 800, the first moisture detection unit 412 may have identified the one or more first areas of the one or more measurement areas. In some examples, the first moisture detection unit 412 may be configured to store the information pertaining to the one or more first areas in the first memory device 404. In an example embodiment, the information pertaining to the one or more first areas of the display screen 110 may include the location of the one or more first areas on the display screen 110. In an example embodiment, the first moisture detection unit 412 may be configured to determine the location of the one or more first areas from the data information pertaining to the each of the one or more measurement areas stored in the first memory device 404, as is illustrated above in table 2.

In some examples, the scope of the disclosure is not limited to check each of the one or more measurement areas for moisture accumulation to identify the one or more first areas. In an alternative embodiment, the controller 402 may be configured to perform the steps of flowchart 800 in parallel for each of the one or more measurement area. In such an embodiment, the controller 402 may not perform the step 802, as each of the one or more measurement areas are being checked for moisture accumulation in parallel. Further, in such an implementation, as soon as the controller 402 determines moisture accumulation in a measurement area of the one or more measurement areas, the controller 402 performs the step 608 for the measurement area.

Referring back to FIG. 6, at the step 608, the display screen 110 includes means, such as the control system 310, the controller 402, the first photo transceiver interface unit 410, and/or the like, for identifying the one or more photo transmitters of the plurality of photo transmitters 314. In an example embodiment, the one or more photo transmitters may correspond to the photo transmitters that correspond to the one or more first areas. To identify the one or more photo transmitters, the first photo transceiver interface unit 410 may be configured to retrieve the data pertaining to the one or more first areas from the first memory device 404. As discussed above, the information data pertaining to the one or more first areas include the location information of the one or more first areas on the display screen 110. Further, as discussed, the location information corresponds to a set of coordinates on the display screen 110 that define each of the one or more first areas on the display screen 110. In some examples, the set of coordinates may define the periphery of the one or more first areas on the display screen 110. For example, if the set of coordinates of a first area includes (0,0), (3,3), (0,3), and (3,0), the coordinates (0,0), (3,3), (3,0), and (0,3) depict the periphery of the first area.

After identifying the location information pertaining to the one or more first areas, the first photo transceiver interface unit 410 may be configured to correlate the location information of the one or more first areas with the location of the plurality of the photo transmitters 314 to identify the one or more photo transmitters of the plurality of the photo transmitters 314 that are included in the one or more first areas. For example, if the first area has the coordinates (0,0), (3,3), (0,3), and (3,0) and the first photo transmitter and the second photo transmitter in the plurality of photo transmitter 314 has coordinates (2,2), and (5,2), the first photo transceiver interface unit 410 determines that the first photo transmitter located at (2,2) is included in the first area while the second photo transmitter located at (5,2) is not included in the first area. Further, the first photo transceiver interface unit 410 may be configured to determine the first photo transmitter as one of the one or more photo transmitters.

At step 610, the display screen 110 includes means, such as the control system 310, the controller 402, the first photo transceiver interface unit 410, and/or the like, for altering the electric current supplied to the one or more photo transmitters of the plurality of photo transmitters 314. In an example embodiment, the first photo transceiver interface unit 410 may be configured to increase the electric current supplied to each of the one or more photo transmitters. Increase in the electric current supplied to the one or more photo transmitters causes the one or more photo transmitters to heat. Because the one or more photo transmitters are included in the one or more first areas (where the moisture has accumulated), the temperature of the one or more first areas increases. The increase in the temperature of the one or more first areas causes the accumulated moisture to evaporate, hence improving the visibility of the display screen 110.

In an example embodiment, the first photo transceiver interface unit 410 may be configured to step-wise increase the electric current supplied to the one or more photo transmitters. For example, the first photo transceiver interface unit 410 may be first configured to increase the electric current by a predetermined amount for a predetermined time period. Thereafter, the controller 402 may be configured to repeat the steps 602-608 to determine whether the moisture has been removed from the one or more first areas. If the one or more first areas do not have accumulated moisture, the first photo transceiver interface unit 410 may be configured to reduce the electric current supplied to the one or more photo transmitters to the default electric current value. However, if the controller 402 determines that the one or more first areas still has the moisture accumulated, the first photo transceiver interface unit 410 may be configured to further increase the electric current supplied to the one or more photo transmitters by the predetermined amount for a predetermined time period. The aforementioned process of increasing the electric current is repeated until the electric current supplied to the one or more photo transmitters becomes equal to a threshold electric current value or the moisture is removed from the one or more first areas.

At step 612, the display screen 110 includes means, such as the control system 310, the controller 402, the pattern generation unit 416, and/or the like, for generating/updating the moisture accumulation pattern. In an example embodiment, the moisture accumulation pattern may correspond to a repository that includes at least a list of one or more second areas on the display screen 110 where the first moisture detection unit 412 has historically detected moisture accumulation. Further, the moisture accumulation pattern may include a moisture accumulation count for each of the one or more second areas. The moisture accumulation count associated with a second area may correspond a number of times the first moisture detection unit 412 has detected moisture accumulation in the second area. Following table illustrates an example moisture accumulation pattern:

TABLE 3

An example moisture accumulation pattern.

| One or more second areas | Location on the display screen 110 | Moisture accumulation count |
|---|---|---|
| second area-1 | (0, 0)(3, 3)(0, 3)(3, 0) | 10 |
| second area-2 | (13, 13)(20, 20)(13, 20)(20, 13) | 7 |

From the example moisture accumulation pattern, it can be observed that the first moisture detection unit 412 has detected 10 instances of moisture accumulation in the second area-1. Further, from the example accumulation pattern, it can be observed that the first moisture detection unit 412 has detected 7 instances of moisture accumulation in the second area-2.

In an example embodiment, to generate/update the moisture accumulation pattern, the first moisture detection unit 412 may be configured to retrieve the information pertaining to the one or more first areas from the first memory device 404. Thereafter, for a first area of the one or more first areas, the first moisture detection unit 412 may be configured to determine whether moisture detection unit 412 has previously detected moisture accumulation in the first area from the moisture accumulation pattern. For example, the first moisture detection unit 412 may be configured to correlate the location of the first area with the location of the one or more second areas (stored in the moisture accumulation pattern) to determine if the first moisture detection unit 412 has previously detected moisture accumulation in the first area. For example, if the first moisture detection unit 412 determines that there exists a second area in the moisture accumulation pattern that has same location as that of the first area, the first moisture detection unit 412 may determine that it has previously detected moisture accumulation in the first area. Accordingly, the first moisture detection unit 412 may update the moisture accumulation count of the second area. On the other hand, if the first moisture detection unit 412 determines that none of the one or more second areas in the moisture accumulation pattern has the same location as that of the first area, the first moisture detection unit 412 may determine that it has not previously detected moisture accumulation in the first area. Accordingly, the first moisture detection unit 412 may create a new entry in the moisture accumulation pattern to include the first area as a new second area. Further, the first moisture detection unit 412 may update the moisture accumulation count of the newly added second area as "1".

In some examples, the scope of the disclosure is not limited to the moisture accumulation pattern only including the list of the one or more second areas and the corresponding moisture accumulation. In an alternative embodiment, the moisture accumulation pattern may further include information pertaining to the temperature of the ambient environment around the display screen 110 in an instance at the first moisture detection unit 412 detects moisture accumulation on the one or more first areas on the display screen 110. As discussed above, the display screen 110 may include the temperature sensing unit 414 that may be configured to utilize the temperature sensor (not shown) in the display screen 110 to determine the temperature of the ambient environment around the display screen 110. The first moisture detection unit 412 may be configured to cause the temperature sensing unit 414 to determine the temperature of the ambient environment in response to the detection of the one or more first areas. Accordingly, the first moisture detection unit 412 may be configured to update/generate moisture accumulation pattern. Following table illustrates another moisture accumulation pattern that includes the information pertaining to the detected temperature of the ambient environment around the display screen 110:

TABLE 4

An example moisture accumulation pattern that includes the temperature information

| Temperature of ambient | One or more second areas | Location on the display screen 110 | Moisture accumulation count |
|---|---|---|---|
| 0 degrees | second area-1 | (0, 0)(3, 3)(0, 3)(3, 0) | 10 |
|  | second area-2 | (13, 13)(20, 20)(13, 20)(20, 13) | 7 |
| −5 degrees | second area-1 | (0, 0)(3, 3)(0, 3)(3, 0) | 14 |
|  | second area-2 | (13, 13)(20, 20)(13, 20)(20, 13) | 17 |

The example moisture accumulation pattern illustrated in the table 4 depicts that the moisture accumulation count in the second area-1 is 10 when the temperature of the ambient environment is 0 degrees, and the moisture accumulation count in the second area-1 is 14 when the temperature of the ambient environment is −5 degrees. The moisture accumulation count in the second area-2 is 7 when the temperature of the ambient environment is 0 degrees, and the moisture accumulation count in the second area-2 is 17 when the temperature of the ambient environment is −5 degrees.

In some example embodiments, the first moisture detection unit 412 may be configured to utilize the moisture accumulation pattern to predict the one or more first areas on the display screen 110 where the moisture may get accumulated. The prediction of the one or more first areas is further described in conjunction with FIG. 12.

FIGS. 10A and 10B illustrate example methods 1000a and 1000b for operating the display screen 110 based on the detection of moisture accumulation on the display screen 110, according to one or more embodiments described herein.

Referring to the example method 1000a, the sectional view of the display screen 110 is depicted. The sectional view of the display screen 110 includes the glass substrate layer 306 and the photo transceiver layer 302. In some examples, the glass substrate layer 306 may be divided into a first measurement area 1002a, and a second measurement area 1002b. Further, it can be observed that the moisture has accumulated on the first measurement area 1002a.

The photo transceiver layer 302 includes the photo transmitters 314a-314e and the second sensors 316a-316e. The photo transmitters 314a, 314b, and 314c are positioned below the first measurement area 1002a. Further, the photo transmitters 314d and 314e are positioned below the second measurement area 1002b. Similarly, the second sensors 316a, and 316b are positioned below the first measurement area 1002a. Further, the second sensors 316c, 316d, and 316e are positioned below the second measurement area 1002b. When the photo transmitters 314a-314c generate the light signal, the portion of the light signals (e.g., 1004) get reflected back to the photo transceiver layer 302 due to presence of the moisture in the first measurement area 1002a. The portion of the light signal (e.g., 1004) is detected by the second sensors 316a and 316b. On the other hand, the light signals generated by the photo transmitters 316d and 316e pass through the glass substrate layer 306, as moisture has not accumulated in the second measurement area 1002b. Accordingly, the second sensors 316c-316e do not receive the reflected portion of the light signals.

Because the second sensors 316a-316b receive the reflected portion of the light signal, the second sensors 316a-316b generate the second signals, which are received by the first photo transceiver interface unit 410. Upon reception of the second signals, the first photo transceiver interface unit 410 may be configured to determine the amplitude measurement (i.e., the one or more characteristics) of the second signals, as is described in the step 604. In an example embodiment, as discussed above, the determined amplitude measurement of the second signals corresponds to the measurement of reflectivity of the display screen 110. Thereafter, the first moisture detection unit 412 may be configured to compare the determined amplitude measurement of the second signal with the first amplitude threshold to determine whether the moisture has accumulated in the corresponding measurement area (e.g., measurement area 1002a), as is described in the step 806. For example, the first moisture detection unit 412 may determine whether the determined amplitude measurement of the second signals satisfies (e.g. is greater than) the first amplitude threshold based on the comparison. If the determined amplitude measurement satisfies (e.g. is greater than) the first amplitude threshold, the first moisture detection unit 412 may determine that the moisture may have got accumulated in the measurement area 1002a. Accordingly, the first photo transceiver interface unit 410 may increase the electric current supplied to the photo transmitters 314a-314c associated with the first measurement area 1002a, as is described in the step 610.

Referring to the example method 1000b as shown in FIG. 10B, the photo transmitters 314a-314e do not generate light signals. In such an embodiment, the second sensors 316a-316e may receive the light signals from the ambient environment round the display screen 110. In such an embodiment, the second sensors 316a-316b may receive only a portion of the light signals from the ambient environment due to presence of the moisture in the first measurement area 1002a. Therefore, the intensity of the light received by the second sensors 316a-316b may be less than the intensity of the light signals received by the second sensors 316c-316e (depicted by dotted light signals 1006). Accordingly, the amplitude of the second signals generated by second sensors 316a-316b will be less than the amplitude of the second signals generated by the second sensors 316c-316e.

The first photo transceiver interface unit 410 may be configured to receive the second signals generated by the second sensors 316a-316e. Thereafter, the first photo transceiver interface unit 410 may be configured to determine the amplitude measurement (measurement of the one or more characteristics) of each of the second signals. The first moisture detection unit 412 may be configured to determine whether the amplitude measurement of the second signals satisfies (e.g., less than) the second amplitude threshold. Because the second sensors 316a-316b may receive only the portion of the light signal from the ambient environment, the amplitude of the second signals generated by the second sensors 316a-316b may satisfy (e.g., less than) the second amplitude threshold. Accordingly, the first moisture detection unit 412 may be configured to determine that the moisture has accumulated in the first measurement area 1002a. Thereafter, the first photo transceiver interface unit 410 may be configured to alter the electric current supplied to the photo transmitters 314a-314c (associated with the first measurement area 1002a).

Figure 11:
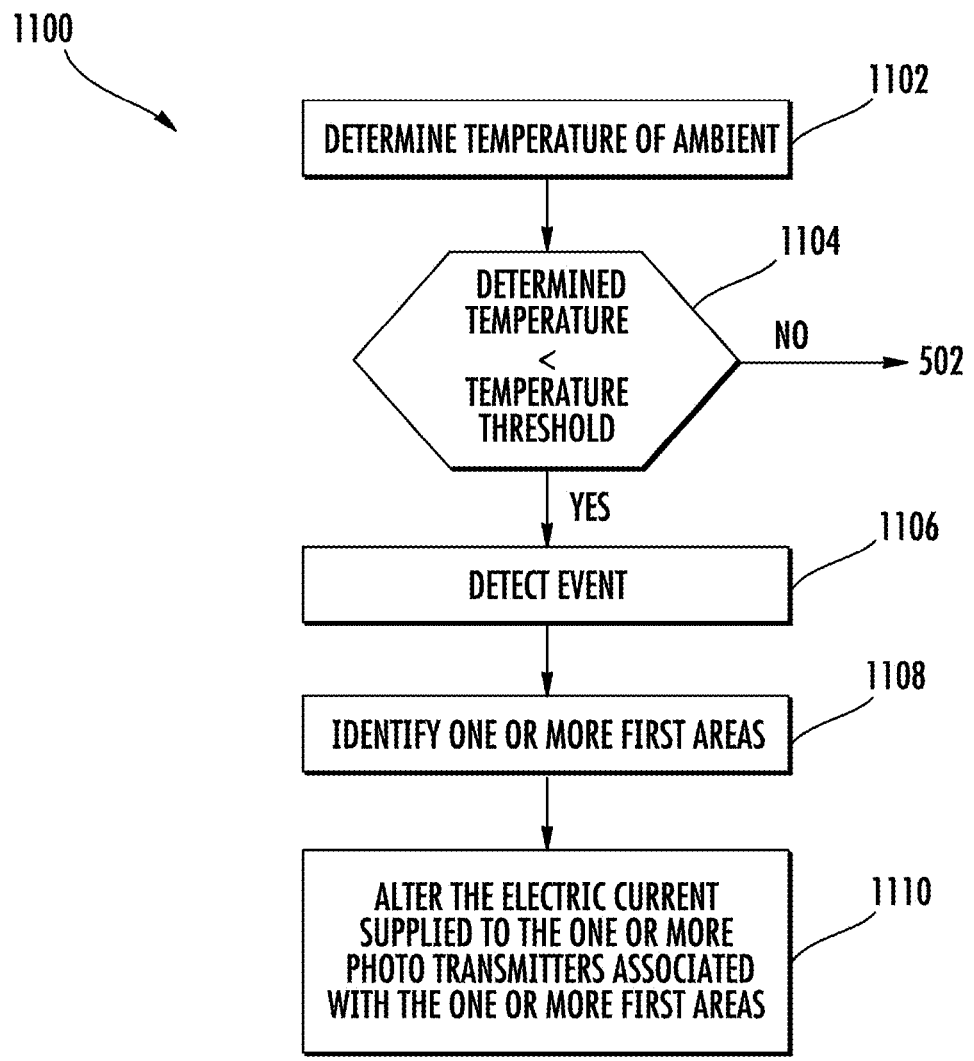
FIG. 11 illustrates a flowchart of a method for operating the display screen associated with the detection of an event based on a temperature of the ambient environment around the display screen satisfying a temperature threshold, according to one or more embodiments described herein.

FIG. 11 illustrates a flowchart 1100 of a method for operating the display screen 110 based on the detection of the event of the temperature of the ambient environment around the display screen 110 satisfying (e.g., being less than or equal to) the temperature threshold, according to one or more embodiments described herein.

At step 1102, the display screen 110 includes means, such as the control system 310, the controller 402, the first temperature sensing unit 414, and/or the like, for determining the temperature of the ambient environment around the display screen 110. In an example embodiment, the first temperature sensing unit 414 may be configured to cause the temperature sensor in the display screen 110 to determine the temperature of the ambient environment around the display screen 110.

At step 1104, the display screen 110 includes means, such as the control system 310, the controller 402, the first temperature sensing unit 414, and/or the like, for determining whether the determined temperature of the ambient environment satisfies (e.g., less than or equal to) the temperature threshold. In an example embodiment, the temperature threshold may correspond to a value of temperature below which there is a high likelihood of moisture accumulation on the display screen 110. For example, if the temperature threshold is 5 degrees Celsius, and if the temperature of the ambient environment dips below 5 degrees Celsius, there is a high likelihood of moisture accumulation on the display screen 110.

If the first temperature sensing unit 414 determines that the determined temperature satisfies (e.g., less than or equal to) the temperature threshold, the controller 402 may be configured to perform the step 1106. However, if the first temperature sensing unit 414 determines that the determined temperature does not satisfy (e.g., greater than) the temperature threshold, the controller 402 may be configured to repeat the step 502.

At step 1106, the display screen 110 includes means, such as the control system 310, the controller 402, and/or the like, for detecting the event. The detected event corresponds to the temperature of the ambient environment around the display screen 110 being below the temperature threshold. Thereafter, at step 1108, the display screen 110 includes means, such as the control system 310, the controller 402, the first moisture detection unit 412, and/or the like, for identifying the one or more first areas from the one or more measurement areas based the moisture accumulation pattern, as is further described in conjunction with FIG. 12.

At step 1110, the display screen 110 includes means, such as the control system 310, the controller 402, the first photo transceiver interface unit 410, and/or the like, for altering the electric current supplied to the one or more photo transmitters associated with the one or more first areas using methodologies described above in conjunction with the step 610. In some examples, as discussed above, the first photo transceiver interface unit 410 may be configured to increase the electric current supplied to the one or more photo transmitters causing the one or more photo transmitters to heat. This further leads to heating of the one or more first areas, which prevents the moisture accumulation in the one or more first areas. Because the one or more first areas are identified based on the moisture accumulation pattern and accordingly are proactively heated, moisture accumulation on the display screen 110 is proactively prevented.

Figure 12:
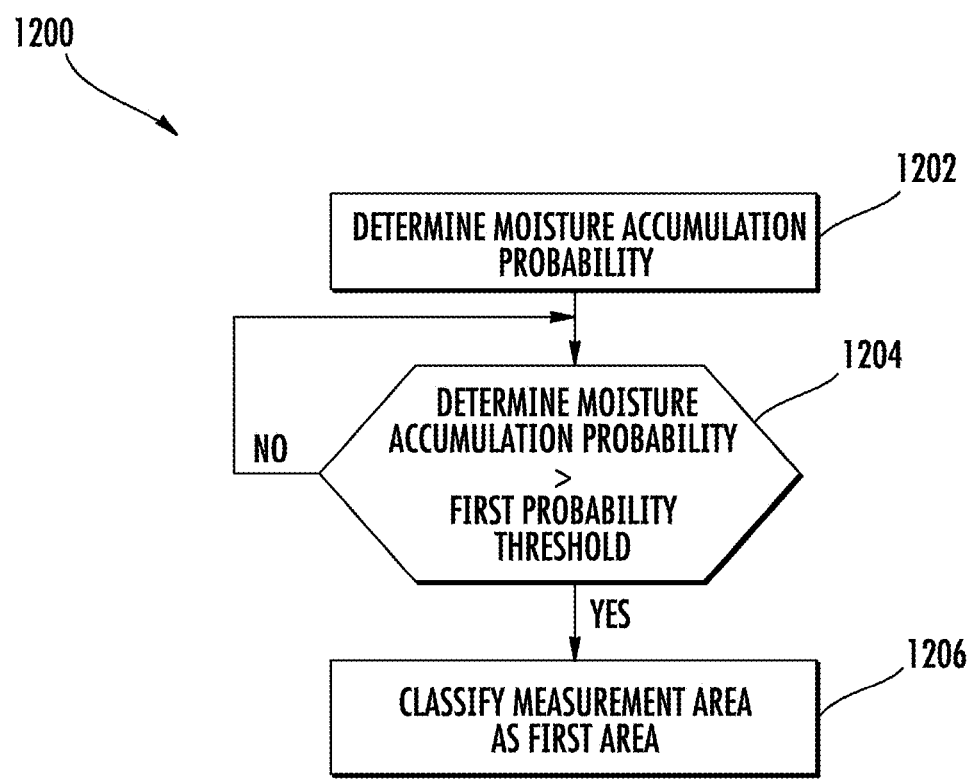
FIG. 12 illustrates a method for identifying one or more first areas based on a moisture accumulation pattern, according to one or more embodiments described herein.

FIG. 12 illustrates a method for identifying the one or more first areas based on the moisture accumulation pattern, according to one or more embodiments described herein.

At step 1202, the display screen 110 includes means, such as the control system 310, the controller 402, the first moisture detection unit 412, and/or the like, for determining a moisture accumulation probability for each of the one or more measurements areas. In an example embodiment, the first moisture detection unit 412 may be configured to determine the moisture accumulation probability based on the moisture accumulation pattern. For example, the first moisture detection unit 412 may be configured to determine, for a measurement area of the one or more measurement areas, the moisture accumulation count. In some examples, as discussed above, the moisture accumulation pattern includes the list of the one or more second areas (where the moisture accumulation was previously detected) and the corresponding moisture accumulation count. Therefore, the first moisture detection unit 412 may determine the moisture accumulation count for the measurement area from the moisture accumulation pattern. For example, referring to table 3, the first moisture detection unit 412, may be configured to determine that the measurement area at the location ((0,0)(3,3)(0,3)(3,0)) (i.e., the second area-1) on the display screen 110 has the moisture accumulation count of 10.

Further, the first moisture detection unit 412 may be configured to determine a total moisture accumulation count from the moisture accumulation pattern. In an example embodiment, the total moisture accumulation count may correspond to a total number of times the first moisture detection unit 412 has detected moisture accumulation on the display screen 110. For example, referring to table 3, the first moisture detection unit 412 determines that total moisture accumulation count as 17 (i.e., the sum of the moisture accumulation count associated with the second area-1 and the moisture accumulation count associated with the second area-2). Thereafter, the first moisture detection unit 412 may be configured to determine the moisture accumulation probability for the measurement area based on the moisture accumulation count associated with the measurement area and the total moisture accumulation count. For instance, the first moisture detection unit 412 may be configured to determine the moisture accumulation probability using the following equation:

$$P(m) = \frac{\text{Moisture accumulation count}}{\text{total moisture accumulation count}} \quad (1)$$

Where,
P(m): moisture accumulation probability associated with the measurement area m.

To this end, the first moisture detection unit 412 may be configured to determine the moisture accumulation probability for the measurement area at the location ((0,0)(3,3)(0,3)(3,0)) as 0.6. Similarly, the first moisture detection unit 412 may be configured to determine the moisture accumulation probability for each of the one or more measurement areas.

At step 1204, the display screen 110 includes means, such as the control system 310, the controller 402, the first moisture detection unit 412, and/or the like, for determining, for the one or more measurement areas, whether the respective moisture accumulation probability satisfies (e.g. is greater than or equal to) a first probability threshold. In an example embodiment, the first probability threshold may correspond to a value of moisture accumulation probability beyond which there is a high likelihood of moisture accumulation. In some examples, the first probability threshold may be pre-stored in the first memory device 404 during manufacturing of the display screen 110.

If the first moisture detection unit 412 determines that the moisture accumulation probability of a measurement area of the one or more measurement areas satisfies (e.g. is greater than) the first probability threshold, the first moisture detection unit 412 may be configured to perform the step 1206. At step 1206, the display screen 110 includes means, such as the control system 310, the controller 402, the first moisture detection unit 412, and/or the like, for classifying the measurement area as the first area. Thereafter, the controller 402 may be configured to perform the step 1110.

However, if the first moisture detection unit 412 determines that the moisture accumulation probability of the measurement area does not satisfy (e.g., less than) the first probability threshold, the first moisture detection unit 412 may be configured to repeat the step 1204 for remaining measurement areas of the one or more measurement areas.

In an example embodiment, based on the method described in the flowchart 1200, the first moisture detection unit 412 identifies the one or more first areas from the one or more measurement areas that have a high moisture accumulation probability in comparison to other measurement areas in the one or more measurement areas. After the identification of the one or more first areas, the controller 402 may be configured to perform the step 1108.

In some embodiments, the scope of the disclosure is not limited to the identifying the one or more first areas based on only on the moisture accumulation pattern, as is illustrated in table 3. In an alternative embodiment, the first moisture detection unit 412 may be configured to identify the one or more first areas based on the moisture accumulation pattern and the temperature of the ambient environment around the display screen 110. In such an embodiment, the first moisture detection unit 412 may utilize the moisture accumulation pattern that includes the temperature data along with the moisture accumulation count associated with the one or more second areas (i.e., the measurement areas where the moisture accumulation was previously detected by the first moisture detection unit 412). For example, the first moisture detection unit 412 may be configured to utilize the moisture accumulation pattern illustrated in table 4 for identification of the one or more first areas. One such method of identification of the one or more first areas is described in conjunction with FIG. 13.

Figure 13:
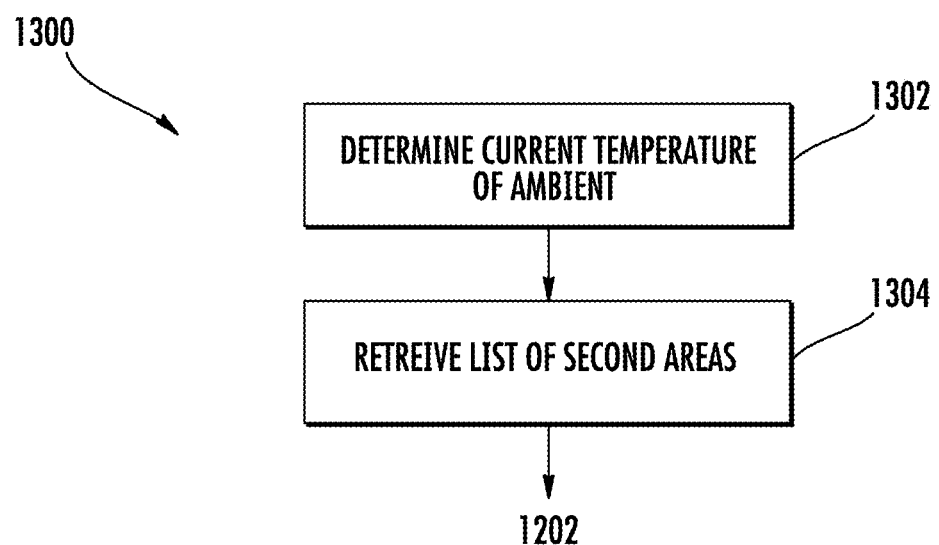
FIG. 13 illustrates a flowchart of another method for identifying the one or more first areas based on the moisture accumulation pattern, according to one or more embodiments described herein.

FIG. 13 illustrates a flowchart 1300 of another method for identifying the one or more first areas based on the moisture accumulation pattern, according to one or more embodiments described herein.

At step 1302, the display screen 110 includes means, such as the control system 310, the controller 402, the first temperature sensing unit 414, and/or the like, for determining the current temperature of the ambient environment around the display screen 110. In an example embodiment, the first temperature sensing unit 414 may be configured to utilize similar methodologies as described in the step 1102 to determine the current temperature of the ambient environment around the display screen 110.

At step 1304, the display screen 110 includes means, such as the control system 310, the controller 402, the first moisture detection unit 412, and/or the like, for retrieving a list of second areas from the moisture accumulation pattern based on the determined current temperature. In an example embodiment, the list of second areas may correspond to the measurement areas on the display screen 110 where the moisture accumulation was previously detected at the determined current temperature. For example, if the current temperature is −5 degrees Celsius, the first moisture detection unit 412 may determine that previously the moisture accumulation was detected in the second area-1 and the second area-2 (referring to table 4). Further, the first moisture detection unit 412 may be configured to retrieve the moisture accumulation count associated with the second areas in the retrieved list of second areas. For example, the first moisture detection unit 412 determines that the second area-1 has moisture accumulation count of 14 at −5 degrees' Celsius temperature. Similarly, the first moisture detection unit 412 may retrieve the moisture accumulation count of the second area-2 from the moisture accumulation pattern (referring to table 4).

Thereafter, the first moisture detection unit 412 may be configured to repeat the steps 1202, 1204, and 1206 to identify the one or more first areas. For example, the first moisture detection unit 412 may determine the moisture accumulation probability for each of the one or more measurement areas in the display screen 110 based on the moisture accumulation count included in the list of second areas and the total moisture accumulation count determined from the list of second areas. For example, the first moisture detection unit 412 determines, from the list of second areas, that the moisture accumulation count of the measurement area at the location ((0,0)(3,3)(0,3)(3,0)) is 14 when the temperature of the ambient environment around the display screen 110 is −5 degrees' Celsius. Further, the first moisture detection unit 412 determines that the total moisture accumulation count is 31 when the temperature of the ambient environment is −5 degrees Celsius. Thereafter, based on the moisture accumulation count and the determined total moisture accumulation count, the first moisture detection unit 412 may be configured to determine the moisture accumulation probability for each of the one or more measurement areas.

Further, the first moisture detection unit 412 may be configured to determine, for the measurement area of the one or more measurement areas, whether the determined moisture accumulation probability satisfies (e.g., greater than) the first probability threshold. If the first moisture detection unit 412 determines that the moisture accumulation probability associated with the measurement area satisfies (e.g., greater than) the first probability threshold, the first moisture detection unit 412 may classify the measurement area as the first area.

In some example embodiments, the scope of the disclosure is not limited to identifying the one or more first areas based on automatic detection of moisture accumulation on the display screen 110 (based either on the moisture accumulation pattern or based on the transmissivity/reflectivity of the displays screen 110). In an alternative embodiment, the operator 108 may provide a touch input on the displays screen 110 to indicate the first area where the moisture may have got accumulated. One such method of identification of the first area based on the reception of the touch input is described in conjunction with FIG. 14.

Figure 14:
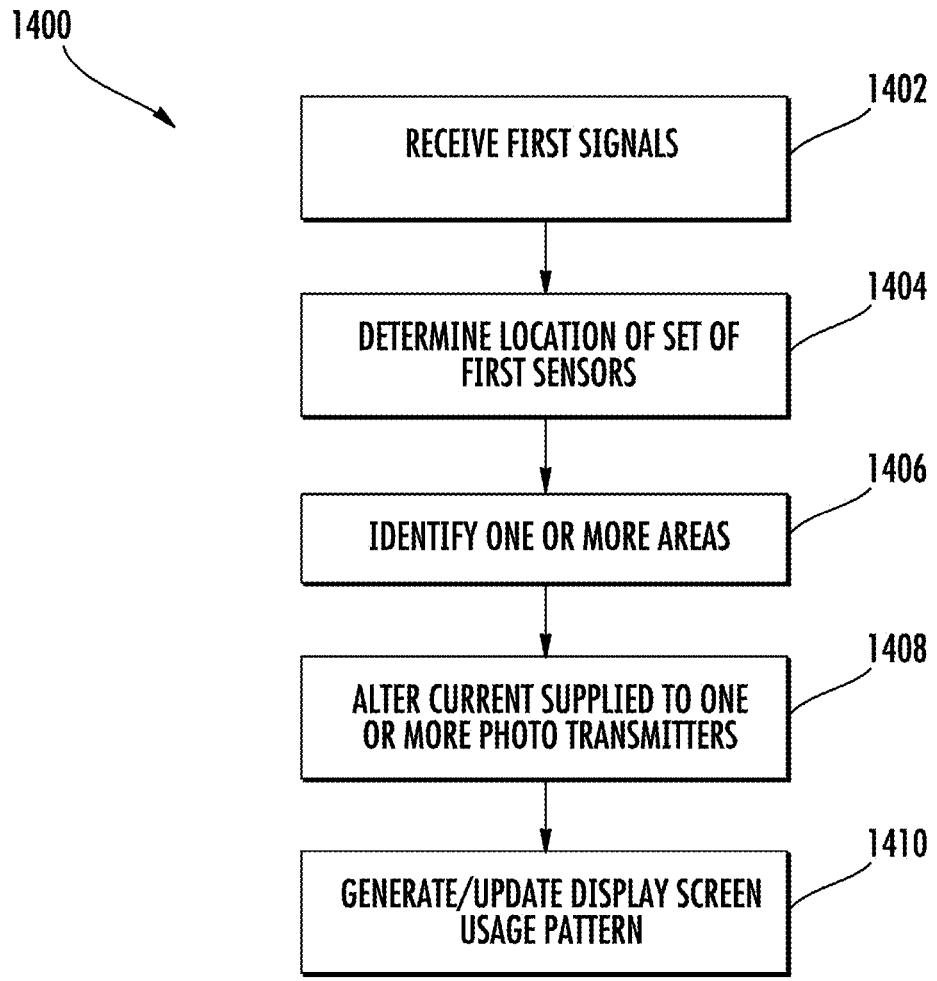
FIG. 14 illustrates a flowchart of a method for operating the display screen based on detection of an event as a reception of a touch input, according to one or more embodiments described herein.

FIG. 14 illustrates a flowchart 1400 of a method for operating the display screen 110 based on detection of the event (for example, a reception of touch input), according to one or more embodiments described herein.

At step 1402, the display screen 110 includes means, such as the control system 310, the controller 402, the first touch interface unit 408, and/or the like, for receiving the first signals from a set of first sensors of the plurality of first sensors. In an example embodiment, the reception of the first signals may be indicative of the reception of the touch input from the operator 108 on the display screen 110. Further, the first touch interface unit 408 receives the first signals from the set of first sensors and detects the event as the reception of the touch input.

At step 1404, the display screen 110 includes means, such as the control system 310, the controller 402, the first touch interface unit 408, and/or the like, for determining the location of the set of first sensors on the display screen 110. As discussed above, the first memory device 404 includes data pertaining to the plurality of first sensors. The data includes the location information of the plurality of first sensors and the unique address associated with each first sensor of the plurality of first sensors. In an example embodiment, based on the reception of the first signals, the first touch interface unit 408 may be configured to uniquely identify the set of first sensors of the plurality of first sensors 318 that has received the touch input. Thereafter, the first touch interface unit 408 may be configured to determine the location of the set of first sensors 318 on the display screen 110 from the data pertaining to the plurality of first sensors 318 stored in the first memory device 404.

At step 1406, the display screen 110 includes means, such as the control system 310, the controller 402, the first touch interface unit 408, and/or the like, for identifying the one or more areas on the display screen 110 based on the determined location of the set of first sensors. As discussed, because the first memory device 404 includes the information pertaining to the unique address and the location of each of the plurality of first sensors 318, the first touch interface unit 408 determines the location of the set of first sensors from the first memory device 404. Based on the location of the set of first sensors, the first touch interface unit 408 may be configured to identify the one or more areas. In some examples, the first photo transceiver interface unit 410 may be configured to consider the one or more identified areas as the one or more first areas. The identification of the one or more first areas is further described in FIG. 16.

In some examples, the scope of the disclosure is not limited to identify the one or more areas as the areas on the display screen 110 that have received the touch input. In an alternative embodiment, the first touch interface unit 408 may be configured to identify the one or more areas based on a gesture input received from the operator 108. In an example embodiment, the gesture may correspond to an action performed by the operator 108 that involves one or more set of first sensors receiving the touch input from the operator 108 in a predetermined sequence. For example, the operator 108 provides a gesture, which causes a first set of first sensors to generate the first signals followed by a second set of first sensors to generate the first signals. In such embodiment, the first touch interface unit 408 may be configured to first receive the first signals from the first set of first sensors followed by the first signal from the second set of first sensors. In some examples, the first set of first sensors is located adjacent to the second set of first sensors. Further, the first touch interface unit 408 may be configured to identify the area as the location of the one or more set of first sensors. For example, the first touch interface unit 408 may be configured to identify the area as the location of the first set of first sensors and the second set of first sensors.

In yet another alternative embodiment, the first touch interface unit 408 may be configured to identify the area as the location of the one or more sets of first sensors and an area encompassed by the one or more one or more sets of first sensors, based on the gesture performed by the operator 108. For example, if the operator 108 provides touch input to draw a closed loop on the display screen 110, the first touch interface unit 408, in such an embodiment, may be configured to identify the area that at least includes the area encompassed by the closed loop.

At step 1408, the display screen 110 includes means, such as the control system 310, the controller 402, the first photo transceiver interface unit 410, and/or the like, for altering the electric current supplied to the one or more photo transmitters associated with the one or more first areas (identified in the step 1404). In an example embodiment, the first photo transceiver interface unit 410 may be configured to utilize similar methodologies as described in the step 610 to alter the electric current supplied to the one or more photo transmitters.

At step 1410, the display screen 110 includes means, such as the control system 310, the controller 402, the first touch interface unit 408, and/or the like, for generating/updating a display screen usage pattern. In an example embodiment, the display screen usage pattern may include information pertaining to one or more third areas on the display screen 110 which has historically received the touch input from the operator 108. In an example embodiment, the display screen usage pattern may further include location information pertaining to the one or more third areas and a touch input count associated with each of the one or more third areas. In an example embodiment, the touch input count may correspond to a number of times that a third area of the one or more third areas have received the touch input from the operator 108. Following table illustrates an example display screen usage pattern:

TABLE 5

| Display screen usage pattern | | |
|---|---|---|
| One or more third areas | Location on the display screen 110 | Touch input count |
| Third area-1 | (0, 0)(3, 3)(0, 3)(3, 0) | 10 |
| Third area-2 | (13, 13)(20, 20)(13, 20)(20, 13) | 7 |

From the aforementioned table, it can be observed that the third area-1 at the location ((0,0)(3,3)(0,3)(3,0)) has historically received 10 touch inputs. Similarly, the third area-2 at the location ((13,13)(20,20)(13,20)(20,13)) has historically received 7 touch inputs.

To update/generate the display screen usage pattern, the first touch interface unit 408 may determine whether the identified area (identified in the step 1404), which has received the touch input, is included in the display screen usage pattern. In an example embodiment, the first touch interface unit 408 may be configured to compare the location of the identified area with the location of the one or more third areas included in the display screen usage pattern to determine whether the identified area, which has received the touch input, is included in the display screen usage pattern. For example, the first touch interface unit 408 determined that the area, which has received the touch input, has a location ((0,0)(3,3)(0,3)(3,0)). Further, based on the comparison of the location of the identified area and the location of the one or more third areas, the first touch interface unit 408 determines that the identified area is included in the display screen usage pattern as the third area-1. Thereafter, the first touch interface unit 408 may be configured to update the touch input count of the third area-1 to 11.

On the other hand, if, based on the comparison of the location of the identified area and the locations of the one or more third areas, the touch interface unit 408 determines that the identified area is not present in the display screen usage pattern, the first touch interface unit 408 may be configured to update the display screen usage pattern to include the identified area as a new third area. Further, the touch interface unit 408 may be configured to update the touch input count of the new third area to 1.

In some examples, the moisture detection unit 412 of the display screen 110 may be configured to utilize the display screen usage pattern to identify a set of third areas from the one or more third areas which may regularly receive touch input from the operator 108. Because the set of third areas may regularly receive the touch input, the controller 402 may instruct the first photo transceiver interface unit 410 to proactively heat the set of third areas so that moisture does not get accumulated in the set of third areas. The prediction of the set of third areas is further described in conjunction with FIG. 17.

In some example embodiments, the scope of the disclosure is not limited to altering the electric current supplied to the one or more photo transmitters every time the touch input is received on the display screen 110. Additionally or alternatively, the method described in the flowchart 1400 may be performed based on the current temperature of the ambient environment around the display screen 110. Such an implementation is described in conjunction with FIG. 15.

Figure 15:
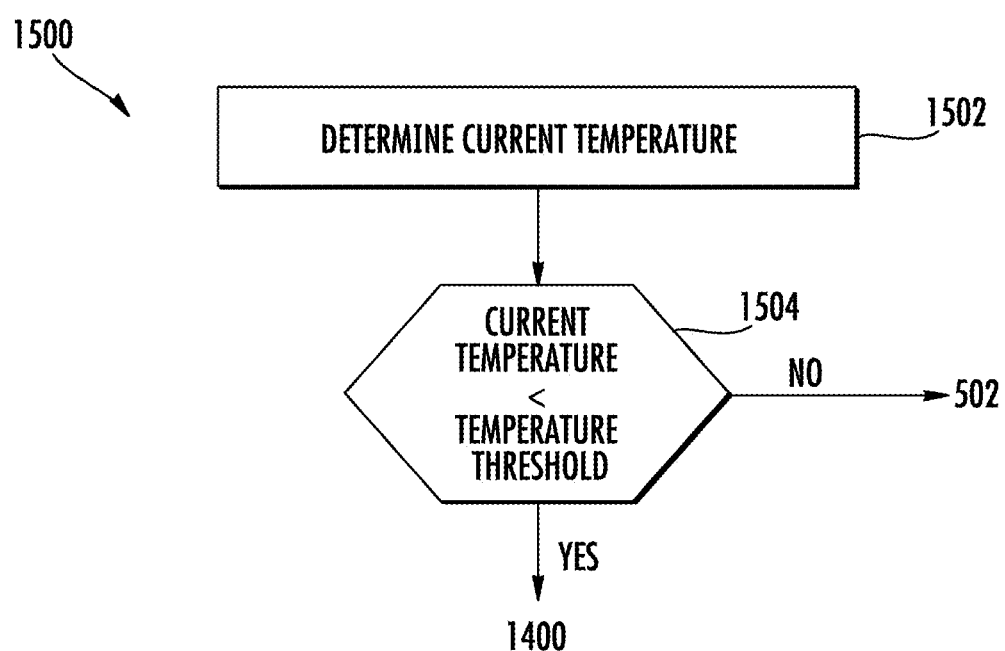
FIG. 15 illustrates a flowchart of another method for operating the display screen based on detection of the event of reception of the touch input on the display screen while the temperature of the ambient environment satisfies the temperature threshold, according to one or more embodiments described herein.

FIG. 15 illustrates a flowchart 1500 of another method for operating the display screen 110 based on detection of the event of reception of the touch input on the display screen 110 while the temperature of the ambient environment satisfies (e.g. is less than) the temperature threshold, according to one or more embodiments described herein.

At step 1502, the display screen 110 includes means, such as the control system 310, the controller 402, the first temperature sensing unit 414, and/or the like, for determining the current temperature of the ambient environment around the display screen 110. In an example embodiment, the first temperature sensing unit 414 may be configured to determine the temperature of the ambient environment using the similar methodologies as described in the step 1102.

At step 1504, the display screen 110 includes means, such as the control system 310, the controller 402, the first temperature sensing unit 414, and/or the like, for determining whether the determined current temperature satisfies (e.g. is less than) the temperature threshold. If the first temperature sensing unit 414 determines that the determined current temperature satisfies (e.g., less than) the temperature threshold, the controller 402 may be configured to perform step 1402 of FIG. 14. However, if the first temperature sensing unit 414 determines that the current temperature of the ambient environment around the display screen 110 does not satisfies (e.g., greater than) the temperature threshold, the first temperature sensing unit 414 may be configured to repeat the step 502 in FIG. 5.

As discussed above in the flowchart 1400, the controller 402 may instruct the first photo transceiver interface unit 410 to heat the one or more first areas (i.e., the one or more areas that have received the touch input from the operator 108) to avoid moisture accumulation in the one or more first areas.

Figure 16:
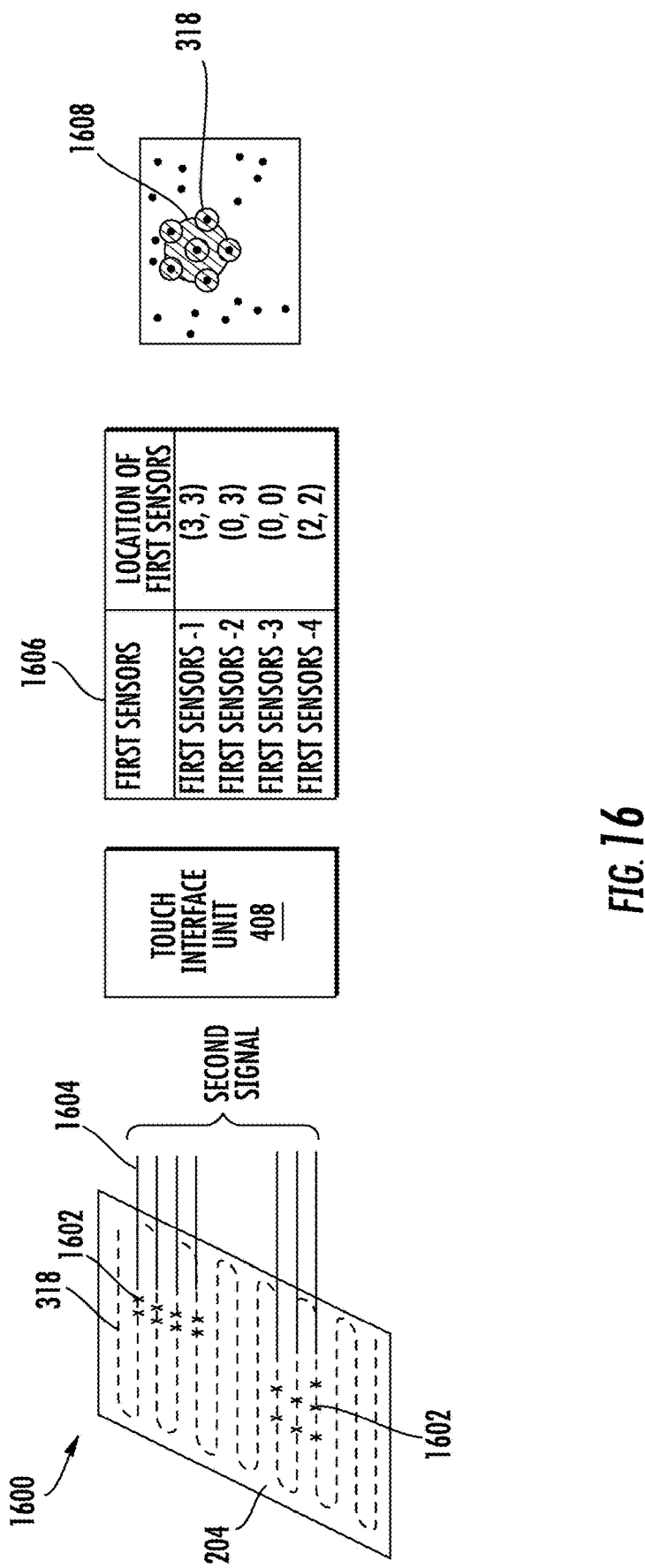
FIG. 16 illustrates an example method for identifying the one or more first areas, according to one or more embodiments described herein.

FIG. 16 illustrates an example method 1600 for identifying the one or more first areas, according to one or more embodiments described herein.

The example method 1600 illustrates that the display screen 110 includes the plurality of first sensors 318. Further, the example method depicts that the set of first sensors 1602 of the plurality of first sensors 318 has generated the first signals (depicted by the 1604). The generated first signals are transmitted to the first touch interface unit 408. On receiving the first signals, the first touch interface unit 408 may generate a list of first sensors (e.g., table 1606) that includes the location of each first sensor in the set of first sensors from which the first touch interface unit 408 has received the first signals. In some examples, the list of the first sensors includes the location information of each first sensor in the set of first sensors. For example, from the table 1606, it can be observed that the list of first sensors includes first sensors located at the coordinates (3,3), (0,3), (0,0), and (2,2). Thereafter, the first touch interface unit 408 may be configured to utilize techniques such as, Cartesian coordinates system, to determine periphery of an area 1608. The periphery of the area is defined in such a manner that the area 1608 includes the first sensors in the list of first sensors (e.g., table 1606).

After the identification of the area 1608 (which has received the touch input), the moisture detection unit 412 may be configured to consider the identified area as the first area. Accordingly, the photo transceiver interface unit 410 alters the electric current supplied to the one or more photo transmitters included in the first area to heat the first area. Heating the first area avoid moisture accumulation in the first area.

Figure 17:
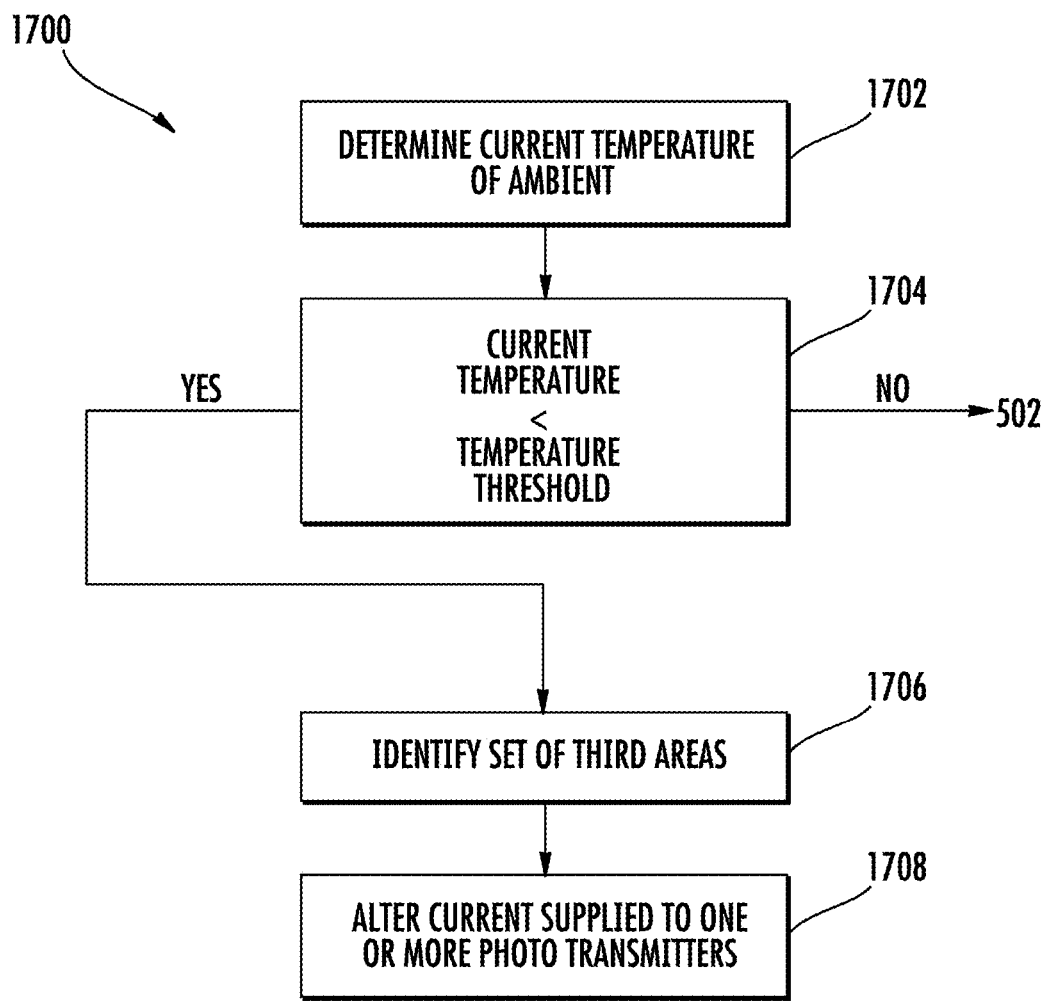
FIG. 17 illustrates a flowchart of another method of operating the display screen based on the detection of an event of the temperature of the ambient environment satisfying the threshold temperature, according to one or more embodiments described herein.

FIG. 17 illustrates a flowchart 1700 of another method of operating the display screen 110 based on the detection of the event of the temperature of the ambient environment satisfying (e.g., less than) the threshold temperature, according to one or more embodiments described herein.

At step 1702, the display screen 110 includes means, such as the control system 310, the controller 402, the first temperature sensing unit 414, and/or the like, for determining the current temperature of the ambient environment around the display screen 110. In an example embodiment, the first temperature sensing unit 414 may be configured to determine the temperature of the ambient environment using the similar methodologies as is described in the step 1102.

At step 1704, the display screen 110 includes means, such as the control system 310, the controller 402, the first temperature sensing unit 414, and/or the like, for determining whether the determined current temperature satisfies (e.g. is less than) the temperature threshold. If the first temperature sensing unit 414 determines that the determined current temperature satisfies (e.g., less than) the temperature threshold, the controller 402 may be configured to perform the step 1706. However, if the first temperature sensing unit 414 determines that the current temperature of the ambient environment around the display screen 110 is does not satisfy (e.g., greater than) the temperature threshold, the first temperature sensing unit 414 may be configured to repeat the step 502.

At step 1706, the display screen 110 includes means, such as the control system 310, the controller 402, the first touch interface unit 408, and/or the like, for identifying a set of third areas from the one or more third areas that may have high probability of receiving the touch input from the operator 108. In an example embodiment, the first touch interface unit 408 may be configured to utilize the display screen usage pattern to identify the set of third areas. The identification of the set of third areas is described later in conjunction with FIG. 18.

In some examples, after the identification of the set of third areas, the first photo transceiver interface unit 410 may be configured to identify the set of third areas as the one or more first areas. Thereafter, at step 1708, the display screen 110 includes means, such as the control system 310, the controller 402, the first photo transceiver interface unit 410, and/or the like, for altering the electric current supplied to the one or more photo transmitters using the methodologies as is described above in the step 610. In an example embodiment, the first photo transceiver interface unit 410 may increase the electric current supplied to the one or more photo transmitters associated with the one or more first areas causing the one or more photo transmitters to heat, which prevents accumulation of the moisture in the one or more first areas of the display screen 110.

Figure 18:
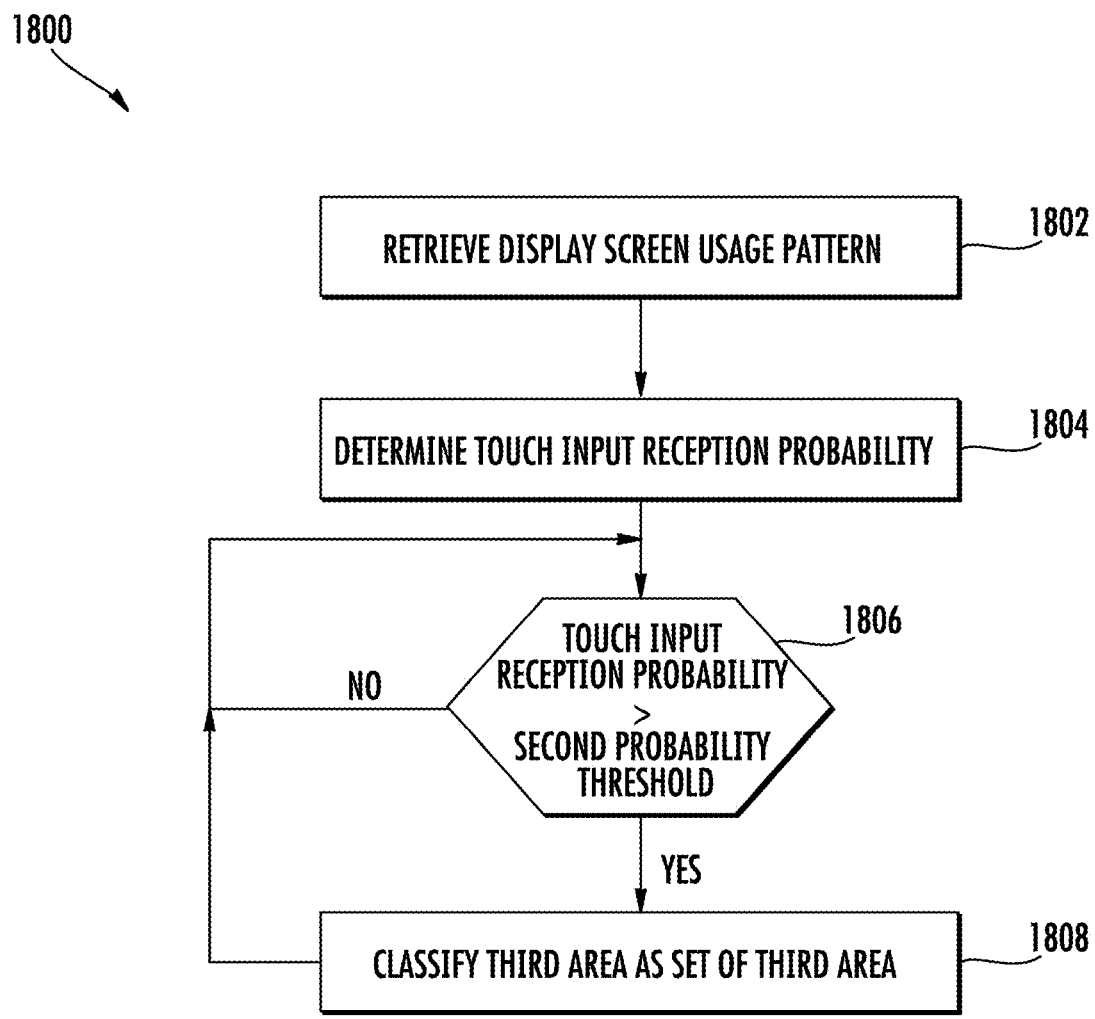
FIG. 18 illustrates a flowchart of a method for identifying a set of third area from one or more third areas on the display screen, according to one or more embodiments described herein.

FIG. 18 illustrates a flowchart 1800 of a method for identifying the set of third area from the one or more third areas on the display screen 110, according to one or more embodiments described herein.

At step 1802, the display screen 110 includes means, such as the control system 310, the controller 402, the first touch interface unit 408, and/or the like, for retrieving the display screen usage pattern from the first memory device 404. As discussed, the display screen usage pattern includes information pertaining to the one or more third areas that have historically received the touch input from the operator 108. Further, as discussed, the information in the display screen usage pattern further includes the touch input count associated with each of the one or more third areas.

At step 1804, the display screen 110 includes means, such as the control system 310, the controller 402, the first touch interface unit 408, and/or the like, for determining a touch input reception probability for each of the one or more third areas. In an example embodiment, the touch input reception probability may correspond to a likelihood of a third area of the one or more third areas receiving the touch input. In an example embodiment, the first touch interface unit 408 may be configured to determine the touch input reception probability for each of the one or more third areas based on the touch input count and the total touch input count. For example, referring to table 5, the first touch interface unit 408, may be configured to determine that the third area-1 has the touch input count of 10. Further, the first touch interface unit 408 may determine, from table 5, that total touch input count is 17.

Thereafter, the first touch interface unit 408 may be configured to determine the touch input reception probability for a third area of the one or more third areas based on the touch input count associated with the third area and the total touch input count. For instance, the touch interface unit 408 may be configured to determine the touch input reception probability using the following equation:

$$P(m) = \frac{\text{touch input count}}{\text{total touch input count}} \quad (1)$$

Where,
P(m): Touch input reception probability of $m^{th}$ third area.

For example, the first touch interface unit 408 may be configured to determine the touch input reception probability for the third area-1 as 0.6. Similarly, the first touch interface unit 408 may be configured to determine the touch input reception probability for each of the one or more third areas.

At step 1806, the display screen 110 includes means, such as the control system 310, the controller 402, the first touch interface unit 408, and/or the like, for determining, for the third area of the one or more third areas, whether the respective touch input reception probability satisfies (e.g. is greater than or equal to) a second probability threshold. If the first touch interface unit 408 determines that the touch input reception probability of the third area of the one or more third areas satisfies (e.g., greater than) the second probability threshold, the first touch interface unit 408 may be configured to perform the step 1808. At step 1808, the display screen 110 includes means, such as the control system 310, the controller 402, the first touch interface unit 408, and/or the like, for classifying the third area as the set of third areas. Thereafter, the first touch interface unit 408 may be configured to repeat the step 1806 for remaining third areas of the one or more third areas. However, if the first touch interface unit 408 determines that the touch input reception probability of the third area does not satisfy (e.g., less than) the second probability threshold, the first touch interface unit 408 may be configured to repeat the step 1806 for remaining third areas of the one or more third areas.

In an example embodiment, based on the method described in the flowchart 1800, the first touch interface unit 408 identifies the set of third areas from the one or more third areas that have a high touch input reception probability in comparison to other third areas in the one or more third areas. After the identification of the set of third areas, the controller 402 may be configured to perform the step 1708.

In some embodiments, the scope of the disclosure is not limited to identifying the one or more first areas either based on the touch input reception probability (i.e., flowchart 1700 and flowchart 1800) associated with the one or more third areas on the display screen 110 or based on the determination of the moisture accumulation probability (i.e., the flowchart 1100 and the flowchart 1200) associated with the one or more measurement areas. In an alternative embodiment, the first moisture detection unit 412 may be configured to identify the one or more first areas based on both the touch input reception probability associated with the one or more third areas and the moisture accumulation probability associated with the one or more measurement areas. One such method of identification of the one or more first areas is described in conjunction with FIG. 19.

Figure 19:
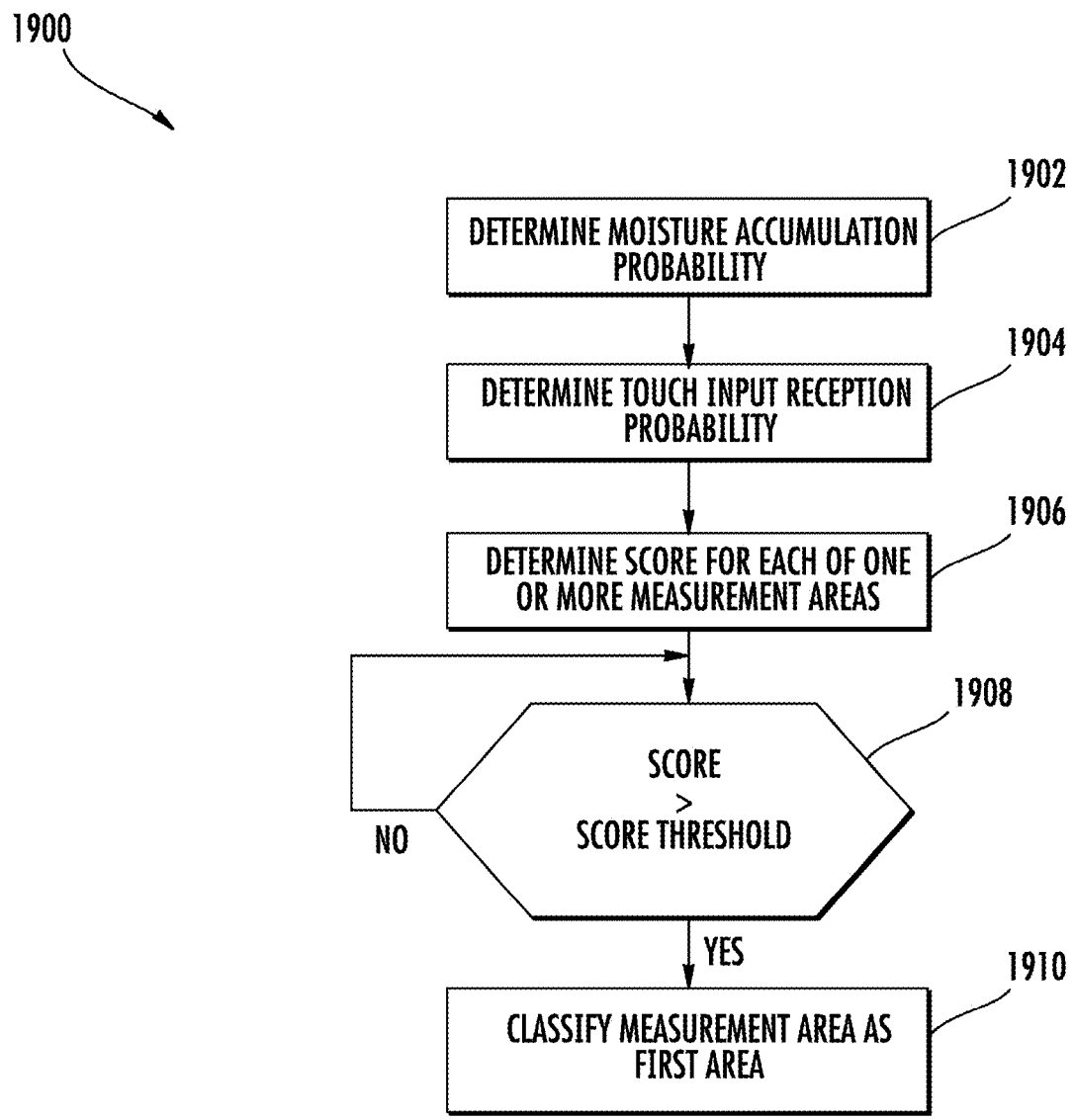
FIG. 19 illustrates a flowchart of another method for identifying one or more first areas, according to one or more embodiments described herein.

FIG. 19 illustrates a flowchart 1900 of another method for identifying the one or more first areas, according to one or more embodiments described herein.

At step 1902, the display screen 110 includes means, such as the control system 310, the controller 402, the first moisture detection unit 412, and/or the like, for determining the moisture accumulation probability for each of the one or more measurement areas. In an example embodiment, the first moisture detection unit 412 may be configured to determine the moisture accumulation probability based on the methodologies described in the flowchart 1200. At step 1904, the display screen 110 includes means, such as the control system 310, the controller 402, the first touch interface unit 408, and/or the like, for determining the touch input reception probability for each of the one or more third areas based on the methodologies described in the flowchart 1800.

In some examples, the one or more measurement areas on the display screen 110 may include the one or more third areas (which has received the touch input from the operator 108). As discussed above, the display screen 110 includes the one or more measurement areas throughout the span of the display screen 110. Further, as discussed above, the operator 108 may have provided touch inputs on the one or more third areas on the display screen 110. Therefore, a first set of measurement areas of the one or more measurement areas may be included in the one or more third areas. In some examples, the operator 108 may have not provided touch input on certain portion of the display screen 110. Therefore, a second set of measurement areas of the one or more measurement areas may not be included in the one or more third areas.

Because the first set of measurement areas has received the touch inputs from the operator 108, the first set of measurement areas may have both the touch reception probability and the moisture accumulation probability associated with them. The following table illustrates the moisture accumulation probability and the touch reception probability associated with each of the one or more measurement areas:

TABLE 6

The moisture accumulation probability and the touch reception probability associated with each of the one or more measurement areas.

| Measurement area | Touch input reception probability | Moisture accumulation probability |
|---|---|---|
| Measurement area-1 | 0.3 | 0.5 |
| Measurement area-4 | 0 | 0.3 |
| Measurement area-3 | 0.7 | 0.2 |

From table 6, it can be observed that the measurement area-1 and measurement area-3 has both the touch input reception probability and the moisture accumulation probability associated with them. Therefore, the measurement area-1 and measurement area-2 are part of the first set of measurement areas. On the other hand, the measurement area-2 only has the moisture accumulation probability associated with it. Therefore, the measurement area-2 is part of the second set of measurement areas.

At step 1906, the display screen 110 includes means, such as the control system 310, the controller 402, the first moisture detection unit 412, and/or the like, for determining a score for each of the one or more measurement areas based on the touch input reception probability and the moisture accumulation probability associated with each of the one or more measurement areas. In an example embodiment, the score associated with a measurement area may correspond to a weighted sum of the touch input reception probability and the moisture accumulation probability associated with the measurement area. The first moisture detection unit 412 may be configured to utilize following equation to determine the weighted sum:

$$\text{Score} = w_m \times \text{moisture accumulation probability} + w_t \times \text{touch input reception probability} \quad (2)$$

Where, $w_m$: weight associated with the moisture accumulation probability; and $w_t$: weight associated with the touch input reception probability.

In an example embodiment, the weight associated with the moisture accumulation probability (hereinafter referred to as the first weight) may correspond to a measurement of importance assigned to the moisture accumulation probability in comparison to the importance of the touch input reception probability. In an example embodiment, the weight associated with the touch input reception probability (hereinafter referred to as second weight) may correspond to a measurement of importance assigned to the touch input reception probability in comparison to the moisture accumulation probability. In an example embodiment, the first weight and the second weight may be pre-stored in the first memory device 404 during manufacturing of the display screen 110. In an alternative embodiment, the operator 108 of the display screen 110 may provide input corresponding to the value of the first weight and the second weight during initialization of the display screen 110, without departing from the scope of the disclosure.

For example, if the first weight is 0.7 and the second weight is 0.3, more importance is assigned to moisture accumulation probability in comparison to the touch input reception probability. To this end, the moisture detection unit 412 may determine the score for the measurement area-1 as 0.44. Similarly, the moisture detection unit 412 may determine the score for the measurement area-2 and measurement area-3 as 0.49 and 0.35, respectively.

After determining the score for each of the one or more measurement areas, at step 1908, the display screen 110 includes means, such as the control system 310, the controller 402, the first moisture detection unit 412, and/or the like, for determining whether the score associated with a measurement area satisfies (e.g., greater than) a score threshold. If the first moisture detection unit 412 determines that the score associated with the measurement area satisfies (e.g., greater than) the score threshold, the first moisture detection unit 412 may be configured to perform the step 1910. At step 1910, the display screen 110 includes means, such as the control system 310, the controller 402, the first moisture detection unit 412, and/or the like, for classifying the measurement area as the first area. Thereafter, the step 1908 is repeated for other measurement areas in the one or more measurement areas.

However, if at the step 1908, the first moisture detection unit 412 determines that the score associated with the measurement area does not satisfy (e.g., less than) the score threshold, the first moisture detection unit 412 may be configured to repeat the step 1908 for other measurement areas in the one or more measurement areas.

Figure 20:
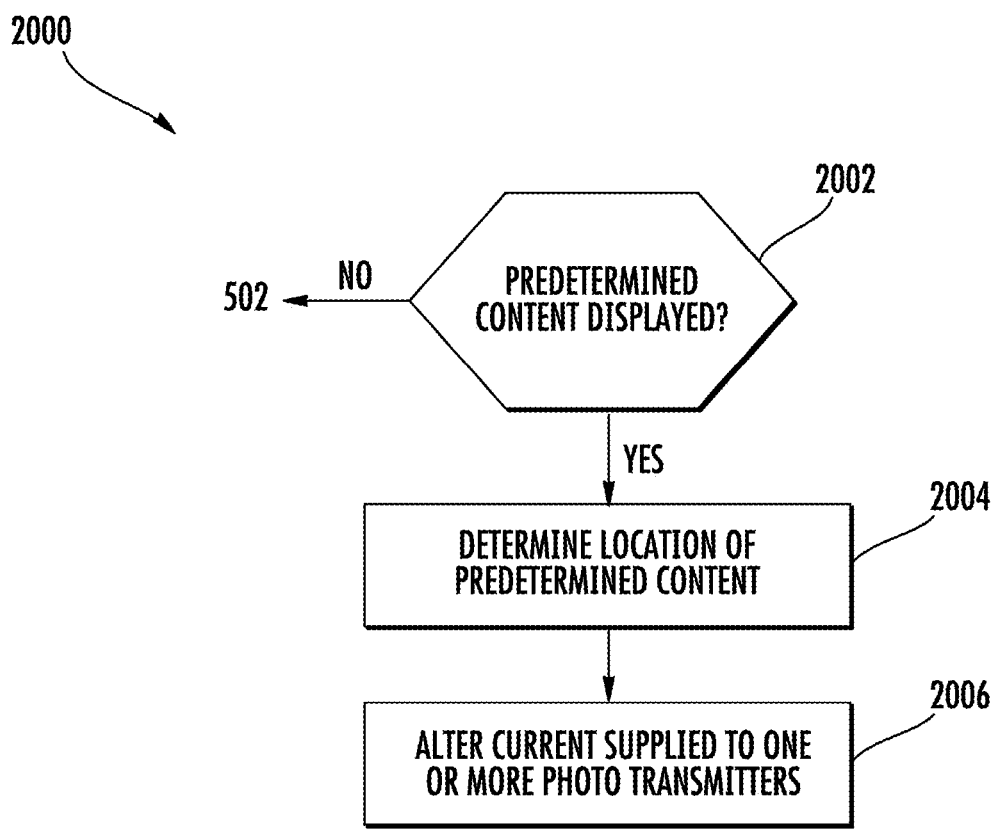
FIG. 20 illustrates a flowchart of another method for operating the display screen based on the detection of the event of display of the predetermined content on the display screen, according to one or more embodiments described herein.

FIG. 20 illustrates a flowchart 2000 of another method for operating the display screen 110 based on the detection of the event of display of the predetermined content on the display screen 110, according to one or more embodiments described herein.

At step 2002, the display screen 110 includes means, such as the control system 310, the controller 402, the first photo transceiver interface unit 410, and/or the like, for determining whether the predetermined content is being displayed on the display screen 110. In some embodiments, because the controller 402 controls the display of content on the display screen 110 (based on the electric current supplied to the plurality of photo transmitters), the controller 402 can determine what content is being displayed through which photo transmitter of the plurality of photo transmitters 314. Accordingly, the controller 402 may determine whether the content displayed on the display screen 110 includes the predetermined content.

If the controller 402 determines that the predetermined content is being displayed on the display screen 110, the controller 402 may be configured to perform step 504. However, if the controller 402 determines that the predetermined content is not being displayed on the display screen 110, the controller 402 may be configured to repeat the step 502.

At step 2004, the display screen 110 includes means, such as the control system 310, the controller 402, the first photo transceiver interface unit 410, and/or the like, for determining the location on the display screen 110 where the predetermined content is being displayed on the display screen 110. As discussed, because the controller 402 controls the display of the content on the display screen 110, controller 402 can determine the one or more photo transmitters of the plurality of photo transmitters 314 that are displaying the predetermined content (e.g., based on the unique address associated with each of the plurality of photo transmitters). Further, based on the unique address associated with the one or more photo transmitters, the controller 402 may be configured to determine the location of the one or more photo transmitters on the display screen 110. For example, the controller 402 may be configured to utilize the location information, pertaining to the plurality of photo transmitters 314, stored in the first memory device 404 to determine the location of the one or more photo transmitters.

After determining the location of the one or more photo transmitters, in an example embodiment, the first moisture detection unit 412 may be configured to determine the location of the one or more photo transmitters as the first area.

At step 2006, the display screen 110 includes means, such as the control system 310, the controller 402, the first photo transceiver interface unit 410, and/or the like, for altering the electric current supplied to the one or more photo transmitters causing the one or more photo transmitters to heat. Heating of the one or more photo transmitters may cause the first area to heat, which avoids moisture accumulation in the first area.

In some example embodiments, the scope of the disclosure is not limited to the predetermined content being displayed at the fixed location on the display screen 110. In an alternative embodiment, the operator 108 may be configured to provide input such as, but not limited to, the touch input to modify the location of the predetermined content on the display screen 110. The controller 402 may be configured to determine updated location of the predetermined content on the display screen 110 and accordingly update the first area. Thereafter, the first photo transceiver interface unit 410 may alter the electric current supplied to the one or more photo transmitters associated with the updated first area causing the updated first area to heat.

Such embodiment allows the operator 108 to modify the heating region by simply providing input (e.g., touch input) to modify the location of the predetermined content on the display screen 110.

Figure 21:
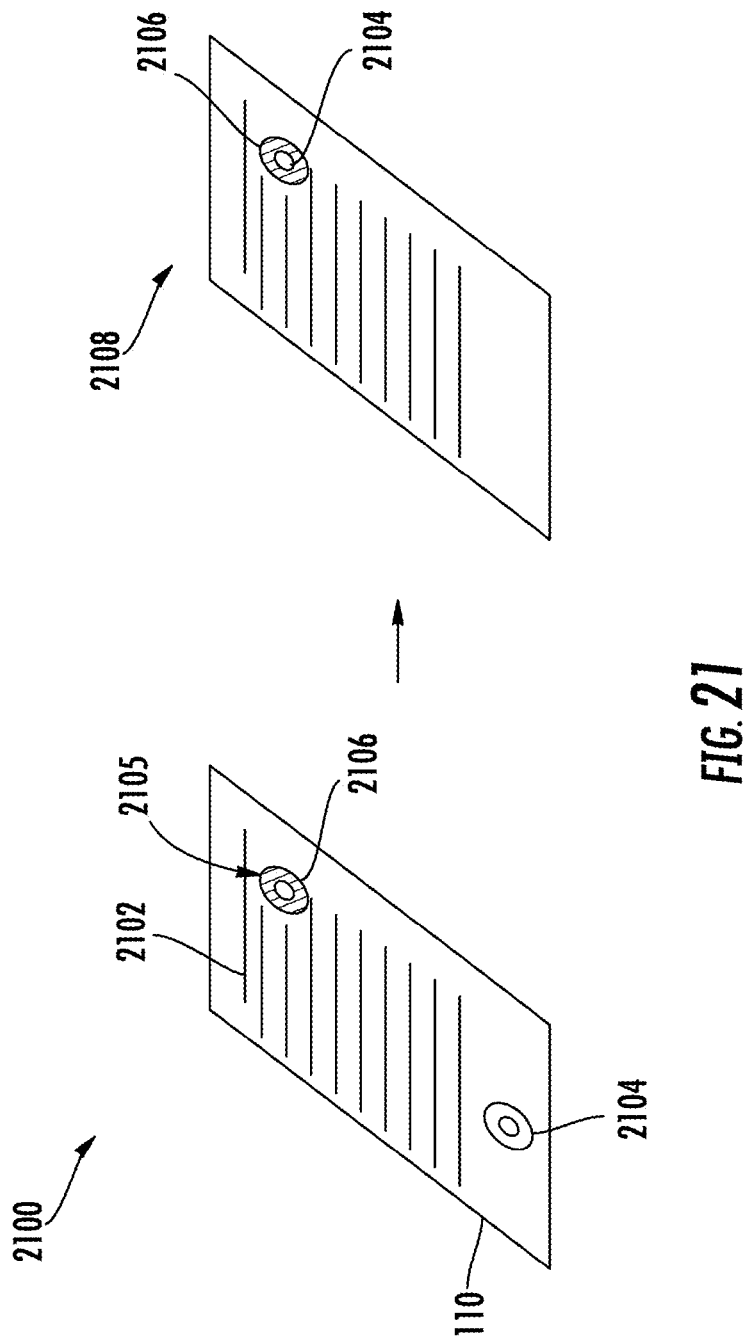
FIG. 21 illustrates an example method for identifying the first area based on display of the predetermined content on the display screen, according to one or more embodiments described herein.

FIG. 21 illustrates an example method 2100 of identifying the first area based on display of the predetermined content on the display screen 110, according to one or more embodiments described herein.

The example method 2100 illustrates the display screen 110 displaying the content 2102. Further, the content 2102 includes a floating icon 2104, which corresponds to the predetermined content. As discussed, the first photo transceiver interface unit 410 may be configured to alter the electric current supplied to the one or more photo transmitters displaying the predetermined content on the display screen 110. This causes the first area where the floating icon is being displayed to heat and accordingly avoid moisture accumulation in the first area.

For example, the operator 108 observes that moisture has accumulated in the portion 2106 of the display screen 110 (e.g., depicted by 2105). In such embodiment, the operator 108 may provide touch input on the display screen 110 to move the floating icon 2104 to the portion 2106 (depicted by 2108). The controller 402 of the display screen 110 may receive the touch input corresponding to the change in the location of the floating icon 2104. In response to the reception of the touch input corresponding to the change in location of the floating icon 2104, the controller 402 may be configured to instruct the one or more photo transmitters at the updated location (i.e., the portion 2106) of the display screen 110 to display the floating icon 2104. Further, the first photo transceiver interface unit 410 may be configured to alter the electric current supplied to the one or more photo transmitters at the updated location (i.e., the portion 2106), causing the portion 2106 on the display screen 110 to heat. In some examples, heating of the portion 2106 may cause the removing of the accumulated moisture.

In some examples the scope of the disclosure is not limited to implementing the functionalities described above in conjunction with the FIGS. 5-21, in the display screen 110. In an alternative embodiment, the functionalities described in the FIGS. 5-21 may be implemented in the electronic device 102, without departing from the scope of the disclosure.

Figure 22:
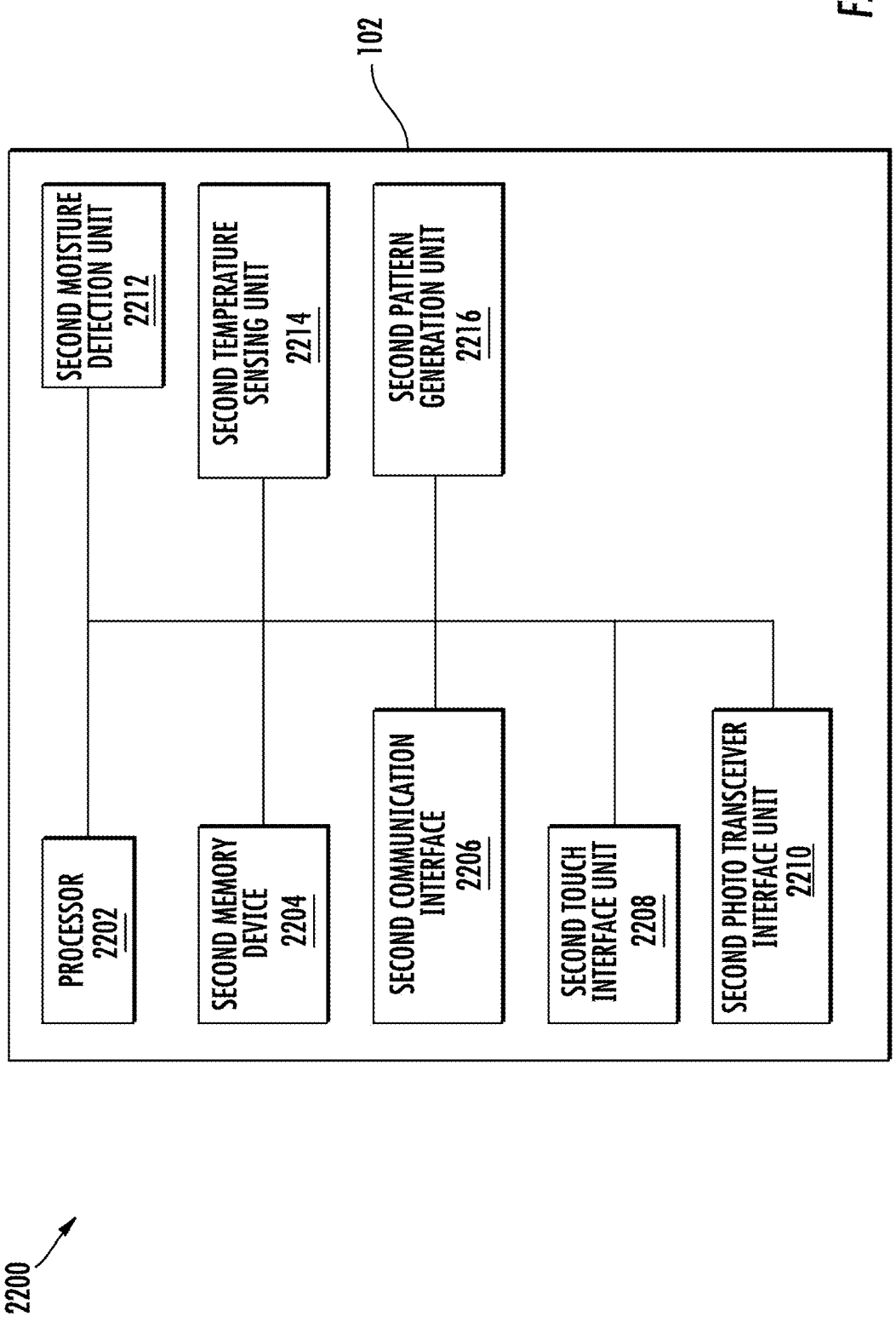
FIG. 22 illustrates a block diagram of the electronic device, according to one or more embodiments described herein.

FIG. 22 illustrates a block diagram 2200 of the electronic device 102, according to one or more embodiments described herein. The electronic device 102 includes a processor 2202, a second memory device 2204, a second communication interface 2206, a second touch interface unit 2208, a second photo transceiver interface unit 2210, a second moisture detection unit 2212, a second temperature sensing unit 2214, and a second pattern generation unit 2216.

The processor 2202 may be embodied as means including one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an application specific integrated circuit (ASIC) or field programmable gate array (FPGA), or some combination thereof. Accordingly, although illustrated in FIG. 22 as a single controller, in an embodiment, the processor 2202 may include a plurality of controllers and signal processing modules. The plurality of controllers may be embodied on a single electronic device or may be distributed across a plurality of electronic devices collectively configured to function as the circuitry of the electronic device 102. The plurality of controllers may be in operative communication with each other and may be collectively configured to perform one or more functionalities of the circuitry of the electronic device 102, as described herein. In an example embodiment, the processor 2202 may be configured to execute instructions stored in the first memory device 404 or otherwise accessible to the processor 2202. These instructions, when executed by the processor 2202, may cause the circuitry of the electronic device 102 to perform one or more of the functionalities, as described herein.

Whether configured by hardware, firmware/software methods, or by a combination thereof, the processor 2202 may include an entity capable of performing operations according to embodiments of the present disclosure while configured accordingly. Thus, for example, when the processor 2202 is embodied as an ASIC, FPGA or the like, the processor 2202 may include specifically configured hardware for conducting one or more operations described herein. Alternatively, as another example, when the processor 2202 is embodied as an executor of instructions, such as may be stored in the first memory device 404, the instructions may specifically configure the processor 2202 to perform one or more algorithms and operations described herein.

Thus, the processor 2202 used herein may refer to a programmable microprocessor, microcomputer or multiple processor chip or chips that can be configured by software instructions (applications) to perform a variety of functions, including the functions of the various embodiments described above. In some devices, multiple processors may be provided dedicated to wireless communication functions and one processor dedicated to running other applications. Software applications may be stored in the internal memory before they are accessed and loaded into the processors. The processors may include internal memory sufficient to store the application software instructions. In many devices, the internal memory may be a volatile or nonvolatile memory, such as flash memory, or a mixture of both. The memory can also be located internal to another computing resource (e.g., enabling computer readable instructions to be downloaded over the Internet or another wired or wireless connection).

In an example embodiment, the second memory device 2204, the second communication interface 2206, the second touch interface unit 2208, the second photo transceiver interface unit 2210, the second moisture detection unit 2212, the second temperature sensing unit 2214, and the second pattern generation unit 2216 are structurally and functionally similar to the first memory device 404, the first communication interface 406, the first touch interface unit 408, the first photo transceiver interface unit 410, the first moisture detection unit 412, the first temperature sensing unit 414, and the first pattern generation unit 416, respectively. For example, the processor 2202 may be configured to detect an event on the display screen 110 of the electronic device 102. In an example embodiment, the event on the display screen may corresponds detection of moisture accumulation on the display screen. Further, the processor 2202 may be configured to identify one or more first areas on the display screen based on the detected event. As discussed, the one or more first areas may correspond to areas on the display screen 110 where the moisture may have got accumulated. Thereafter, the processor 2202 may instruct the second photo transceiver interface unit 2210 to alter the electric current supplied to one or more photo transmitters associated with the one or more first areas of the display screen. For instance, the second photo transceiver interface unit 2210 may increase the electric current supplied to the one or more photo transmitters causing the one or more photo transmitters to heat, which in turn further heats the one or more first areas.

In some example embodiments, certain ones of the operations herein may be modified or further amplified as described below. Moreover, in some embodiments additional optional operations may also be included. It should be appreciated that each of the modifications, optional additions or amplifications described herein may be included with the operations herein either alone or in combination with any others among the features described herein.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The hardware used to implement the various illustrative logics, logical blocks, modules, and circuits described in connection with the aspects disclosed herein may include a general purpose processor, a digital signal processor (DSP), a special-purpose processor such as an application specific integrated circuit (ASIC) or a field programmable gate array (FPGA), a programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively or in addition, some steps or methods may be performed by circuitry that is specific to a given function.

In one or more example embodiments, the functions described herein may be implemented by special-purpose hardware or a combination of hardware programmed by firmware or other software. In implementations relying on firmware or other software, the functions may be performed as a result of execution of one or more instructions stored on one or more non-transitory computer-readable media and/or one or more non-transitory processor-readable media. These instructions may be embodied by one or more processor-executable software modules that reside on the one or more non-transitory computer-readable or processor-readable storage media. Non-transitory computer-readable or processor-readable storage media may in this regard comprise any storage media that may be accessed by a computer or a processor. By way of example but not limitation, such non-transitory computer-readable or processor-readable media may include RAM, ROM, EEPROM, FLASH memory, disk storage, magnetic storage devices, or the like. Disk storage, as used herein, includes compact disc (CD), laser disc, optical disc, digital versatile disc (DVD), floppy disk, and Blu-ray disc™, or other storage devices that store data magnetically or optically with lasers. Combinations of the above types of media are also included within the scope of the terms non-transitory computer-readable and processor-readable media. Additionally, any combination of instructions stored on the one or more non-transitory processor-readable or computer-readable media may be referred to herein as a computer program product.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components may be used in conjunction with the supply management system. Therefore, it is to be understood that the inventions are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

What is claimed is:

1. An electronic device comprising:
    a display screen comprising:
        a plurality of photo transmitters;
        a plurality of first sensors configured to detect one or more touch inputs on the display screen and generate one or more first signals;
    a processor communicatively coupled to the display screen, the processor configured to:
        generate a display screen usage pattern based at least in part on the one or more first signals detected by the plurality of first sensors;
        identify one or more first areas on the display screen based on at least the display screen usage pattern; and
        alter one or more electric currents supplied to one or more photo transmitters of the plurality of photo transmitters associated with the one or more first areas, causing the one or more photo transmitters to generate heat in the one or more first areas.

2. The electronic device of claim 1, wherein the display screen further comprises a plurality of second sensors positioned among the plurality of photo transmitters and configured to generate a plurality of second signals indicative of moisture accumulation on the display screen.

3. The electronic device of claim 2, wherein the processor is further configured to generate a moisture accumulation pattern based at least in part on the plurality of second signals generated by the plurality of second sensors, wherein the one or more first areas on the display screen are identified based on the moisture accumulation pattern.

4. The electronic device of claim 3, wherein the moisture accumulation pattern indicates one or more second areas on the display screen, wherein the processor has historically determined moisture accumulation in the one or more second areas on the display screen.

5. The electronic device of claim 2, wherein the plurality of second sensors are a plurality of light sensors, wherein each of the plurality of second signals is indicative of a transmissivity measurement or a reflectivity measurement of a corresponding measurement area on the display screen.

6. The electronic device of claim 5, wherein the processor is further configured to:
    determine that the transmissivity measurement of the corresponding measurement area satisfies a transmissivity threshold; and
    identify the corresponding measurement area as one of the one or more first areas.

7. The electronic device of claim 5, wherein the processor is further configured to:
    determine that the reflectivity measurement of the corresponding measurement area satisfies a reflectivity threshold; and
    identify the corresponding measurement area as one of the one or more first areas.

8. The electronic device of claim 1, wherein the plurality of first sensors are a plurality of touch screen sensors.

9. The electronic device of claim 1, wherein the display screen usage pattern indicates one or more third areas on the display screen, wherein the one or more third areas have historically received touch inputs as detected by the plurality of first sensors.

10. The electronic device of claim 1 further comprises a temperature sensor communicatively coupled to the processor and configured to determine a temperature of an ambient environment around the display screen.

11. The electronic device of claim 10, wherein the processor is further configured to:
    determine that the temperature of the ambient environment satisfies a temperature threshold; and
    determine the one or more first areas on the display screen based on the temperature.

12. A display screen comprising:
    a photo transceiver layer comprising a plurality of photo transmitters and a plurality of light sensors;
    a glass substrate layer disposed on the photo transceiver layer;
    a controller communicatively coupled to the plurality of photo transmitters and the plurality of light sensors, wherein the controller is configured to:
        receive a plurality of second signals from the plurality of light sensors, wherein the plurality of second signals is indicative of a transmissivity measurement or a reflectivity measurement of one or more measurement areas on the glass substrate layer;
        identify one or more first areas from the one or more measurement areas based on the transmissivity measurement or the reflectivity measurement associated with each of the one or more measurement areas; and
        alter one or more electric currents supplied to one or more photo transmitters of the plurality of photo transmitters associated with the one or more first areas, causing the one or more photo transmitters to generate heat in the one or more first areas of the display screen.

13. The display screen of claim 12, wherein the controller is further configured to generate a moisture accumulation pattern based on identification of the one or more first areas.

14. The display screen of claim 13, wherein the moisture accumulation pattern includes one or more second areas on the glass substrate layer, wherein the controller has historically determined moisture accumulations in the one or more second areas on the glass substrate layer.

15. A method for operating a display screen of an electronic device, the method comprising:

detecting, by a processor, an event on the display screen of the electronic device based on an input received from a plurality of sensors in the display screen, wherein the event on the display screen corresponds to at least detecting a moisture accumulation on the display screen;

identifying, by the processor, one or more first areas on the display screen based on the detected event; and altering, by the processor, one or more electric currents supplied to one or more photo transmitters associated with the one or more first areas of the display screen, wherein the one or more photo transmitters is configured to generate heat in the one or more first areas.

16. The method of claim 15, wherein the event on the display screen corresponds to receiving a touch input through the display screen.

17. The method of claim 16, wherein a plurality of first sensors of the plurality of sensors are configured to detect the touch input through the display screen and generate one or more first signals based on the touch input.

18. The method of claim 17 further comprising generating a display screen usage pattern that indicates one or more third areas on the display screen based on the one or more first signals.

19. The method of claim 15 further comprising receiving, by the processor, a plurality of second signals from a plurality of second sensors of the plurality of sensors in the display screen, wherein the plurality of second signals is indicative of a transmissivity measurement or a reflectivity measurement of the display screen, wherein the one or more first areas on the display screen based on the plurality of second signals.

20. The method of claim 15, wherein the event corresponds to a display of a predetermined content on the display screen, wherein the one or more first areas are identified based on the display of the predetermined content on the display screen.

* * * * *